(12) United States Patent
Asayama et al.

(10) Patent No.: US 6,881,597 B2
(45) Date of Patent: Apr. 19, 2005

(54) METHOD OF MANUFACTURING A SEMICONDUCTOR DEVICE TO PROVIDE A PLURALITY OF TEST ELEMENT GROUPS (TEGS) IN A SCRIBE REGION

(75) Inventors: Kyoichiro Asayama, Higashiyamato (JP); Yasuhiro Mitsui, Fuchu (JP); Fumiko Arakawa, Kodaira (JP); Shiro Kamohara, Hachioji (JP); Yuzuru Ohji, Hinode (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/051,056

(22) Filed: Jan. 22, 2002

(65) Prior Publication Data

US 2003/0006795 A1 Jan. 9, 2003

(30) Foreign Application Priority Data

Jan. 22, 2001 (JP) ....................................... 2001-013028

(51) Int. Cl.[7] ............................................... H01L 21/00
(52) U.S. Cl. ........................................................ 438/18
(58) Field of Search ...................... 438/17, 18; 324/765; 257/48

(56) References Cited

U.S. PATENT DOCUMENTS 5,475,318 A * 12/1995 Marcus et al. .............. 324/762
5,936,876 A * 8/1999 Sugasawara ................. 365/51
6,159,826 A * 12/2000 Kim et al. .................. 438/460
6,319,792 B1 * 11/2001 Sumitani .................... 438/401
6,368,943 B1 * 4/2002 Ohde et al. ................. 438/462

FOREIGN PATENT DOCUMENTS

| JP | 54-111286 | 8/1979 |
|---|---|---|
| JP | 8-88258 | 4/1996 |
| JP | 8-153763 | 6/1996 |
| JP | 9-26436 | 1/1997 |
| JP | 9-196970 | 7/1997 |
| JP | 9-326425 | 12/1997 |
| JP | 11-133061 | 5/1999 |

* cited by examiner

Primary Examiner—Evan Pert
(74) Attorney, Agent, or Firm—Antonelli, Terry, Stout & Kraus, LLP

(57) ABSTRACT

Disclosed is a technique capable of improving a yield of a semiconductor device by measuring a plurality of TEGs arranged in a scribe region. A first electrode pad connected to each terminal of a TEG is formed as a rectangular, minute, isolated pattern having a side length of about 0.5 μm or shorter and constituted of an uppermost layer wiring on a semiconductor substrate, and therefore, a great number of TEGs can be laid in a first scribe region. The characteristic evaluation or the failure analysis is performed by contacting a nanoprobe having a tip radius of curvature of 0.05 μm to 0.8 μm to the first electrode pad.

6 Claims, 22 Drawing Sheets

METHOD OF MANUFACTURING A SEMICONDUCTOR DEVICE TO PROVIDE A PLURALITY OF TEST ELEMENT GROUPS (TEGS) IN A SCRIBE REGION

TECHNICAL FIELD OF THE INVENTION

The present invention relates to a semiconductor device and a technique for manufacturing the same. Particularly, the present invention relates to a technique effectively applicable to a semiconductor device having a semiconductor element used in a characteristic evaluation or a failure analysis.

BACKGROUND OF THE INVENTION

The conventional characteristic evaluation or the failure analysis of a semiconductor element has been performed using an apparatus, for example, prober, in which a needle called a probe is contacted to an electrode formed on a surface of a test element group (hereinafter, referred to as TEG), and then an electrical contact to a specific portion of the semiconductor element is measured.

Some methods have been proposed to determine measurements using the prober. For example, in Japanese Patent Application Laid-Open No. 9-326425, by S. Tomimatsu et al., a method is disclosed in which a plurality of probes each having a sharp tip are brought close to the electrodes of the test elements by means of a probe movement mechanism under the control by a probe movement control circuit while observing them using a scanning electron microscope until a contact current is saturated, and, after contacting them surely, a current-voltage characteristic between the probes is measured by an electrical characteristic measurement circuit.

Also, in Japanese Patent Application Laid-Open No. 9(1997)-26436, by T. Hasegawa et al., a method is disclosed in which a plurality of probes, each having a sharp tip, are arranged at more than 30° intervals in azimuthal angle while they are inclined from a normal of a surface of the test element.

Also, in Japanese Patent Application Laid-Open No. 8-88258, by H. Yamaguchi et al., a method is disclosed in which a needle of a probe is contacted to a portion corresponding to an operating region such that a part of a current, which is obtained by irradiating an electron beam or an ion beam focused on the operating region or its vicinity on a surface or a cross section of a semiconductor material piece, flows to the minute needle of the probe, and the scanning is then performed to measure the current, thereby detecting the change of the current in the operating region.

Also, in Japanese Patent Application Laid-Open No. 8-153763, by K. Yoshida, there is described a method of detecting a voltage by the use of a measuring probe in a drain side which is contacted to a measuring electrode provided to measure a potential of a drain electrode and a measuring probe in a source side which is contacted to a source electrode in a vertical semiconductor device such as MOSFET.

Also, in Japanese Patent Application Laid-Open No. 9-196970, by T. Murakami et al., there is described a probe card, including a plurality of probes; a ring-shaped printed circuit board having a wiring pattern connected to each of the probes; and a ring-shaped holding stage for holding the probe, which is mounted concentrically and engaged with a central hole of the printed circuit board.

Also, in Japanese Patent Application Laid-Open No. 54-111286, by M. Honma, a method is disclosed in which after adhering a conductive material to a rear surface of a semiconductor wafer, the semiconductor wafer is placed on a stage of a wafer prober, a voltage is applied to the stage, and, thereafter, inspection of the semiconductor device is made.

Also, in Japanese Patent Application Laid-Open No. 11-133061, by K. Kunimasa, there is described a probe card, including a plurality of probe needles to be contacted to electrode pads of a semiconductor integrated circuit formed in a plurality of pellet regions on a wafer; and a plurality of dummy needles to be contacted to scribe lines in the vicinity of the pellet region having an electrode pad when the probe needle contacts to the electrode pad.

SUMMARY OF THE INVENTION

Incidentally, a TEG used to evaluate a semiconductor product on a wafer is usually arranged in a region called a scribe region at which the wafer is cut and divided into chips. Further, both a reduction in the size of a chip area and a narrowing of the scribe region are encouraged in order to increase the number of chips obtained per a wafer. On the other hand, many patterns necessary for a manufacturing process of, for example, a phototarget and an alignment mark are included in the scribe region, and thus the number of the TEGs to be disposed therein is limited. In addition, 70 to 80% of the region in which the TEGs are arranged is occupied by electrode pads having a side length of about 100 $\mu$m, to which the probe is contacted. Therefore, except for the TEGs for wafer inspection used to check the quality of a chip, only a small number of TEGs for evaluation can be arranged.

In such a circumstance, the inventors of this invention clarified the fact that, even in a case of the occurrence of a failure in a semiconductor product or the reduction of a yield of the semiconductor product, the effective TEG capable of analyzing them was not established, and thus it was impossible to take prompt measures to cope with such failures.

Moreover, also in an actual device of a semiconductor product, an electrode pad for failure analysis is apt to be eliminated with the reduction of the chip area. Especially, in an integrated circuit dedicated to a specific application what is called an ASIC (application specific integrated circuit), a diagnosis method called a BIST (built-in self test) method is employed in which a test pattern generator is incorporated in a chip, and in the BIST method, even the signal input/output pad for inspecting a circuit function and a device function is eliminated.

Therefore, even in a case of the reduction of a yield of a semiconductor product, the optional measurement for analyzing it can not be performed from outside, and thus it is difficult to specify the cause of the failure.

An object of the present invention is to provide a technique capable of improving a yield of a semiconductor device by measuring a plurality of TEGs arranged in a scribe region.

Also, an object of the present invention is to provide a technique capable of improving a yield of a semiconductor device by performing a characteristic evaluation or a failure analysis of an actual device of a semiconductor product.

The above and other objects and novel features of the present invention will be readily apparent from the description and the accompanying drawings of this specification.

The advantages achieved by the typical ones of the inventive aspects disclosed in this application are briefly described as follows.

(1) In the semiconductor device of the present invention, a plurality of TEGs provided with rectangular first electrode pads having a side length of 0.5 μm or shorter and constituted of the uppermost layer wiring are arranged in a scribe region.
(2) In the semiconductor device of the present invention, a plurality of TEGs provided with rectangular first electrode pads having a side length of 1 μm or shorter and constituted of the uppermost layer wiring are arranged in a scribe region.
(3) In the semiconductor device of the present invention, a plurality of TEGs provided with rectangular first electrode pads having a side length of 10 μm or shorter and constituted of the uppermost layer wiring are arranged in a scribe region.
(4) In a measuring method of the semiconductor device of the present invention, a plurality of TEGs provided with rectangular first electrode pads having a side length of 10 μm or shorter and constituted of the uppermost layer wiring are arranged in a scribe region while a surface of the first electrode pad is covered with a protection film, and after partially exposing the surface of the first electrode pad by removing the protection film on the first electrode pad, a probe having a tip radius of curvature of about 0.05 μm to 0.8 μm is contacted to the first electrode pad, and then the TEG is measured.
(5) In a measuring method of the semiconductor device of the present invention, a logic circuit is arranged in a product circuit region whose uppermost layer is covered with a protection film, and after removing a predetermined part of the protection film to expose a surface of an extraction electrode constituted of the uppermost layer wiring, a probe having a tip radius of curvature of about 0.05 μm to 0.8 μm is contacted to the extraction electrode, and then the logic value of the logic circuit is evaluated.
(6) In a measuring method of the present invention, a TEG is arranged in a product circuit region whose uppermost layer is covered with a protection film, and after removing a predetermined part of the protection film to partially expose a surface of an extraction electrode constituted of the uppermost layer wiring, a probe having a tip radius of curvature of about 0.05 μm to 0.8 μm is contacted to the extraction electrode, and then the TEG is measured.

According to the foregoing methods, a number of TEGs can be arranged in the scribe region, and the large amount of data can be obtained by evaluating the characteristic of the TEGs. Therefore, it becomes possible to maintain and improve the yield of a semiconductor product in the development and the mass production thereof.

The characteristic evaluation or the failure analysis of an actual device can be performed by contacting a probe having a sharp tip to an arbitrary extraction electrode of a semiconductor product. Thereby, it becomes possible to identify the various characteristics and the failure portion in each basic circuit unit. In addition, it is possible to narrow down the failure portion and the failure circuit in the go semiconductor product in a short time. Thus, the improvement of the yield of the semiconductor product can be achieved.

Additional inventive aspects disclosed in this application are described, as follows.

1. A semiconductor device in which a plurality of TEGs provided with rectangular first electrode pads having a side length of 10 μm or shorter and constituted of the uppermost layer wiring and a plurality of TEGs provided with rectangular second electrode pads having a side length of 20 μm or longer and constituted of the uppermost layer wiring are arranged in a scribe region.

2. A semiconductor device in which a plurality of TEGs provided with rectangular first electrode pads having a side length of 10 μm or shorter and constituted of the uppermost layer wiring and a plurality of TEGs provided with rectangular second electrode pads having a side length of 20 μm or longer and constituted of the uppermost layer wiring are arranged in a scribe region, and the second electrode pad is connected commonly to the plurality of TEGs.

3. A semiconductor device in which a plurality of TEGs provided with both of rectangular first electrode pads having a side length of 10 μm or shorter and constituted of the uppermost layer wiring and rectangular second electrode pads having a side length of 20 μm or longer and constituted of the uppermost layer wiring are arranged in a scribe region.

4. A semiconductor device in which a plurality of TEGs provided with both rectangular first electrode pads having a side length of 10 μm or shorter and constituted of the uppermost layer wiring and rectangular second electrode pads having a side length of 20 μm or longer and constituted of the uppermost layer wiring are arranged in a scribe region, and the second electrode pad is connected commonly to the plurality of TEGs.

5. A semiconductor device in which a plurality of TEGs provided with rectangular first electrode pads having a side length of 10 μm or shorter and constituted of the uppermost layer wiring are arranged in a scribe region, and the length of one side of the first electrode pad is not longer than the dimension obtained by adding the diameter of a connection hole between the first electrode pad and the lower layer wiring thereof and the length of an alignment margin between the first electrode pad and the connection hole.

6. A semiconductor device in which a plurality of TEGs provided with rectangular first electrode pads having a side length of 10 μm or shorter and constituted of the uppermost layer wiring are arranged in a scribe region, and the length of one side of the first electrode pad is about four-thirds of the diameter of a connection hole between the first electrode pad and the lower layer wiring thereof.

7. A semiconductor device in which a plurality of TEGs provided with rectangular first electrode pads having a side length of 10 μm or shorter and constituted of the uppermost layer wiring are arranged in a scribe region, and the scribe region is covered with a protection film.

8. A semiconductor device in which a plurality of TEGs provided with rectangular first electrode pads having a side length of 10 μm or shorter and constituted of the uppermost layer wiring are arranged in a scribe region, and the first electrode pad is exposed in the island shape.

9. A semiconductor device in which a plurality of TEGs provided with rectangular first electrode pads having a side length of 10 μm or shorter and constituted of the uppermost layer wiring are arranged in a first scribe region and a plurality of TEGs provided with rectangular second electrode pads having a side length of 20 μm or longer and constituted of the uppermost layer wiring are arranged in a second scribe region, and a surface of the first electrode pad is covered with a protection film and a surface of the second electrode pad is partially exposed by removing the protection film.

10. A semiconductor device in which a plurality of TEGs provided with extraction electrodes constituted of the uppermost layer wiring are arranged in a product circuit region.

11. A method of measuring a semiconductor device in which a plurality of TEGs provided with rectangular first electrode pads having a side length of 10 μm or shorter and constituted of the uppermost layer wiring are arranged in a scribe region while a surface of the first electrode pad is covered with a protection film, and after partially exposing the surface of the first electrode pad by removing the protection film on the first electrode pad, a probe having a tip radius of curvature of about 0.05 μm to 0.8 μm is contacted to the first electrode pad to measure the TEG, and thereby the improvement of the yield of the semiconductor product can be achieved.

12. A method of measuring a semiconductor device in which a plurality of TEGs provided with rectangular first electrode pads having a side length of 10 μm or shorter and constituted of the uppermost layer wiring are arranged in a scribe region while a surface of the first electrode pad is covered with a protection film, and after the protection film on the first electrode pad is removed by the focused ion beam method or the selective etching method to partially expose the surface of the first electrode pad, a probe having a tip radius of curvature of about 0.05 μm to 0.8 μm is contacted to the first electrode pad, and then the TEG is measured.

13. A method of measuring a semiconductor device in which a plurality of TEGs provided with rectangular first electrode pads having a side length of 10 μm or shorter and constituted of the uppermost layer wiring are arranged in a first scribe region while a surface of the first electrode pad is covered with a protection film, and a plurality of TEGs provided with rectangular second electrode pads having a side length of 20 μm or longer and constituted of the uppermost layer wiring are arranged in a second scribe region while a surface of the second electrode pad is partially exposed by removing the protection film on the second electrode pad, and after partially exposing a surface of the first electrode pad by removing the protection film on the first electrode pad, a probe having a tip radius of curvature of about 0.05 μm to 0.8 μm is contacted to the first electrode pad, and then the TEG is measured.

14. A method of measuring a semiconductor device in which a logic circuit is arranged in a product circuit region whose uppermost layer is covered with a protection film, and after exposing a part of a surface of an extraction electrode, constituted of the uppermost layer wiring, by removing a predetermined part of the protection film, a probe having a tip radius of curvature of about 0.05 μm to 0.8 μm is contacted to the extraction electrode to evaluate the logic value of the logic circuit, and thereby the improvement of the yield of the semiconductor product can be achieved.

15. A method of measuring a semiconductor device in which a logic circuit is arranged in a product circuit region whose uppermost layer is covered with a protection film, and after exposing a part of a surface of an extraction electrode, constituted of the uppermost layer, by removing a predetermined part of the protection film by the focused ion beam method or the selective etching method, a probe having a tip radius of curvature of about 0.05 μm to 0.8 μm is contacted to the extraction electrode to evaluate the logic value of the logic circuit.

16. A method of measuring a semiconductor device in which a logic circuit having n input terminals and m output terminals is arranged in a product circuit region whose uppermost layer is covered with a protection film, and after exposing a part of a surface of an extraction electrode, constituted of the uppermost layer wiring, by removing a predetermined part of the protection film, n+m+3 probes having a tip radius of curvature of about 0.05 μm to 0.8 μm, respectively, are contacted to the extraction electrode to evaluate the logic value of the logic circuit.

17. A method of measuring a semiconductor device in which a logic circuit having n input terminals and m output terminals is arranged in a product circuit region whose uppermost layer is covered with a protection film, and after exposing a part of a surface of an extraction electrode, constituted of the uppermost layer wiring, by removing a predetermined part of the protection film, n+m+3 probes including one probe for contact confirmation which have a tip radius of curvature of about 0.05 μm to 0.8 μm, respectively, are contacted to the extraction electrode to evaluate the logic value of the logic circuit.

18. A method of measuring a semiconductor device in which TEGs are arranged in a product circuit region whose uppermost layer is covered with a protection film, and after exposing a part of a surface of an extraction electrode, constituted of the uppermost layer wiring, by removing a predetermined part of the protection film, a probe having a tip radius of curvature of about 0.05 μm to 0.8 μm is contacted to the extraction electrode to measure the TEG, and thereby the improvement of the yield of the semiconductor product can be achieved.

19. A method of measuring a semiconductor device in which TEGs are arranged in a product circuit region whose uppermost layer is covered with a protection film, and after exposing a part of a surface of an extraction electrode, constituted of the uppermost layer wiring, by removing a predetermined part of the protection film by the focused ion beam method or the selective etching method, a probe having a tip radius of curvature of about 0.05 μm to 0.8 μm is contacted to the extraction electrode to measure the TEG.

20. A method of manufacturing a semiconductor device including the steps of: forming rectangular first electrode pads having a side length of 10 μm or shorter and constituted of the uppermost layer wiring in a scribe region and forming a bonding pad constituted of the uppermost layer wiring in a product circuit region; forming a protection film on an upper layer of the uppermost layer wiring; and partially exposing a surface of the bonding pad by removing a predetermined part of the protection film, and the uppermost layer wiring is formed by depositing a conductive body and the patterning by the lithography method.

21. A method of manufacturing a semiconductor device including the steps of: forming rectangular first electrode pads having a side length of 10 μm or shorter and second electrode pads having a side length of 20 μm or longer, which are constituted of the uppermost layer wiring in a scribe region, and forming a bonding pad constituted of the uppermost layer wiring in a product circuit region; forming a protection film on an upper layer of the uppermost layer wiring; and partially exposing a surface of the second electrode pad and a surface of the bonding pad by removing a predetermined part of the protection film, and the uppermost layer wiring is formed by depositing a conductive body and the patterning by the lithography method.

22. A method of manufacturing a semiconductor device including the steps of: sequentially forming a first insulating film, a stopper insulating film, and a second insulating film on a semiconductor substrate; forming a connection hole in the first insulating film and forming a wiring trench in the stopper insulating film and the second insulating film; burying a conductor film in the connection hole and the wiring trench and removing the conductor film in the region outside the connection hole and the wiring trench by the CMP method, thereby forming a first electrode pad formed together with the connection member in a scribe region; forming a protection film on an upper layer of the first electrode pad; and removing the protection film and the second insulating film in the scribe region with the stopper insulating film used as an etching stopper layer, thereby exposing the first electrode pad.

23. A method of manufacturing a semiconductor device including the steps of: sequentially forming a first insulating film, a stopper insulating film, and a second insulating film on a semiconductor substrate; forming a connection hole in the first insulating film and forming a wiring trench in the stopper insulating film and the second insulating film; burying a conductor film in the connection hole and the wiring trench and removing the conductor film in the region outside the connection hole and the wiring trench by the CMP method, thereby forming a first electrode pad formed together with the connection member in a scribe region and simultaneously forming a bonding pad formed together with the connection member in a product circuit region; forming a protection film on an upper layer of the first electrode pad and the bonding pad; and exposing the first electrode pad by removing the protection film and the second insulating film in the scribe region and simultaneously partially exposing a surface of the bonding pad by removing a predetermined part of the protection film in the product circuit region with the stopper insulating film used as an etching stopper layer.

24. A method of manufacturing a semiconductor device including the steps of: sequentially forming a first insulating film, a stopper insulating film, and a second insulating film on a semiconductor substrate; forming a connection hole in the first insulating film and forming a wiring trench in the stopper insulating film and the second insulating film; burying a conductor film in the connection hole and the wiring trench and removing the conductor film in the region outside the connection hole and the wiring trench by the CMP method, thereby forming a first electrode pad formed together with the connection member in a first scribe region, and forming a second electrode pad formed together with the connection member in a second scribe region, and further forming a bonding pad formed together with the connection member in a product circuit region; forming a protection film on an upper layer of the first electrode pad, the second electrode pad, and the bonding pad; and exposing the first electrode pad by removing the protection film and the second insulating film in the first scribe region, and partially exposing a surface of the second electrode pad by removing a predetermined part of the protection film in the second scribe region, and further partially exposing a surface of the bonding pad by removing a predetermined part of the protection film in the product circuit region with the stopper insulating film used as an etching stopper layer.

BRIEF DESCRIPTION OF THE DRAWINGS

FIG. 6 is an enlarged view showing a part of the TEG arranged in the first scribe region, in which

FIG. 9 is an enlarged view showing a part of the TEG arranged in the second scribe region, in which

DESCRIPTION OF THE PREFERRED EMBODIMENTS

Hereinafter, embodiments of the present invention will be described based on the accompanying drawings. Note that the components having the same function are added by the same reference symbol in the entire drawings for describing the embodiments, and repetitive descriptions thereof will be omitted.

Note that, when mentioning a semiconductor device in this application, the semiconductor device is not limited to the one formed on a single crystal silicon substrate but includes the one formed on other substrates such as an SOI (Silicon on insulator) substrate or a TFT (Thin film transistor) substrate unless clearly specified to the contrary. In addition, a wafer indicates any one of a single crystal silicon substrate (generally having a round shape), an SOI substrate, a glass substrate, other insulating or semi-insulating substrate, a semiconductor substrate, and a substrate made by combining them, which are used to manufacture a semiconductor device.

A chip or a chip region indicates a unit integrated circuit region corresponding to the region into which a wafer is divided after the finish of the pre-process for the wafer.

Also, in the embodiments described below, when referring to the number of an element (including number of pieces, values, amount, range, or the like), the number of the element is not limited to a specific number unless clearly specified or except the case where the number is apparently limited to a specific number in principle. The number larger or smaller than the specified number is applicable. Further, in the embodiments described below, it goes without saying that the components (including element steps) are not always indispensable unless clearly specified or except the case where the components are apparently indispensable in principle.

Similarly, in the embodiments described below, when the shape of the components, positional relation thereof, and the like are mentioned, the substantially approximate and similar shapes and the like are included therein unless clearly specified to the contrary or except the case where it can be conceived that they are apparently excluded in principle. For example, a "rectangular shape" means a quadrangle such as a rectangle and a square, and also includes a round-cornered square and an oblique square. This condition is also applicable to the numerical value and the range described above.

(First Embodiment)

Figure 1:
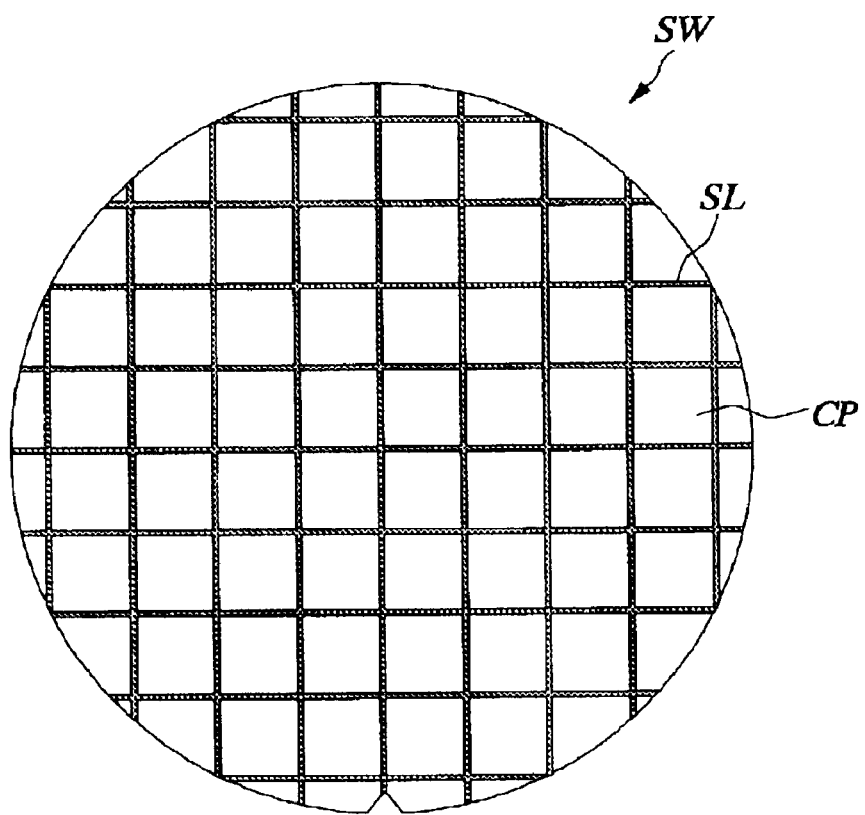
FIG. 1 is a plan view showing a scribe region in a wafer according to the first embodiment.

FIG. 1 shows a scribe region SL on a wafer SW.

A chip CP on which a semiconductor integrated circuit is manufactured is not created separately one by one, but several tens of or hundreds of them are simultaneously manufactured together on one wafer SW, and then the wafer is divided into each of the chips CP. A step for dividing the wafer SW into each of the chips CP is called a dicing or a scribing, in which the wafer SW is completely cut by a circular cutting blade having a width of about 50 $\mu$m and rotating at a high speed. The region used in the abovementioned cutting is a scribe region (represented by a half-tone dot meshing in FIG. 1), which has a width of, for example, about 100 $\mu$m.

Guard bands functioning to prevent the water from permeating into the semiconductor integrated circuit are formed around the semiconductor integrated circuit, and the region sandwiched between the adjacent guard bands can be taken as a scribe region SL. As described later, this guard band has a layered structure in which wirings, plugs to connect between upper and lower wirings, and the like are layered.

Figure 2A:
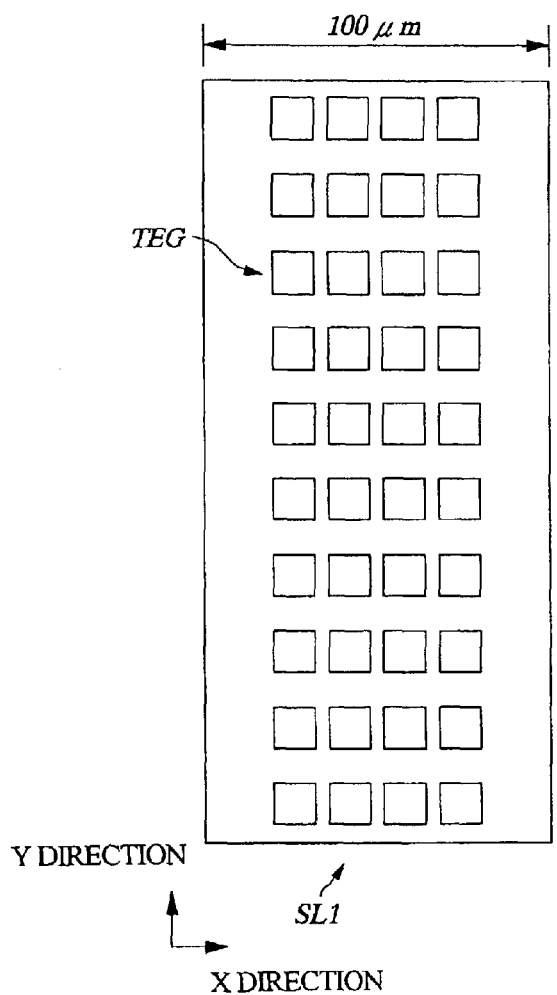
FIG. 2A is a schematic view showing the scribe region in which a plurality of TEGs are arranged according to the first embodiment and FIG. 2B is a schematic diagram showing another part of the scribe region in which a plurality of TEGs are arranged according to the first embodiment.
Figure 2B:
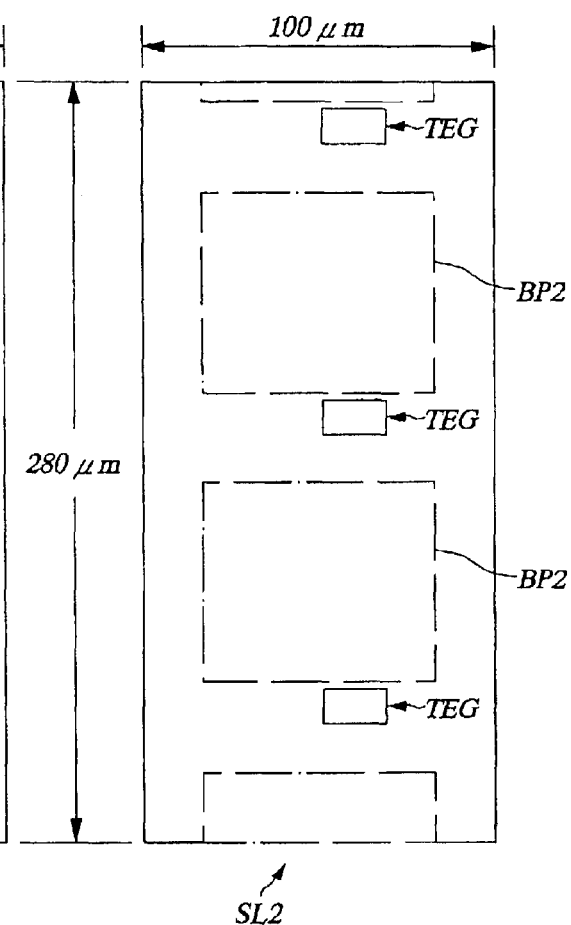

FIG. 2A is a schematic diagram showing a part of the scribe region (first scribe region SL1) in which a plurality of TEGs are arranged, and FIG. 2B is a schematic diagram showing another part of the scribe region (second scribe region SL2) in which a plurality of TEGs are arranged according to the first embodiment. The widths of the first and second scribe regions SL1 and SL2 are both about 100 $\mu$m.

In the first scribe region SL1, a plurality of TEGs having first electrode pads (not shown) are laid tightly, to which a sharp probe (hereinafter, referred to as nanoprobe) having a tip radius of curvature of about 0.05 $\mu$m to 0.8 $\mu$m can be contacted while observing them using a scanning electron microscope. For example, forty TEGs are arranged in a region having a width (X direction) of about 100 $\mu$m and a length (Y direction) of about 280 $\mu$m. The first electrode pads described above are disposed in the arrangement regions of the TEGs represented by rectangles in FIG. 2A.

In the second scribe region SL2, a plurality of TEGs having second electrode pads BP2 (not shown) are arranged, to which a probe having a tip radius of curvature of about 10 $\mu$m to 20 $\mu$m can be contacted while observing them using a scanning electron microscope. For example, three to four TEGs are arranged in a region having a width (X direction) of about 100 $\mu$m and a length (Y direction) of about 280 $\mu$m.

Figure 3:
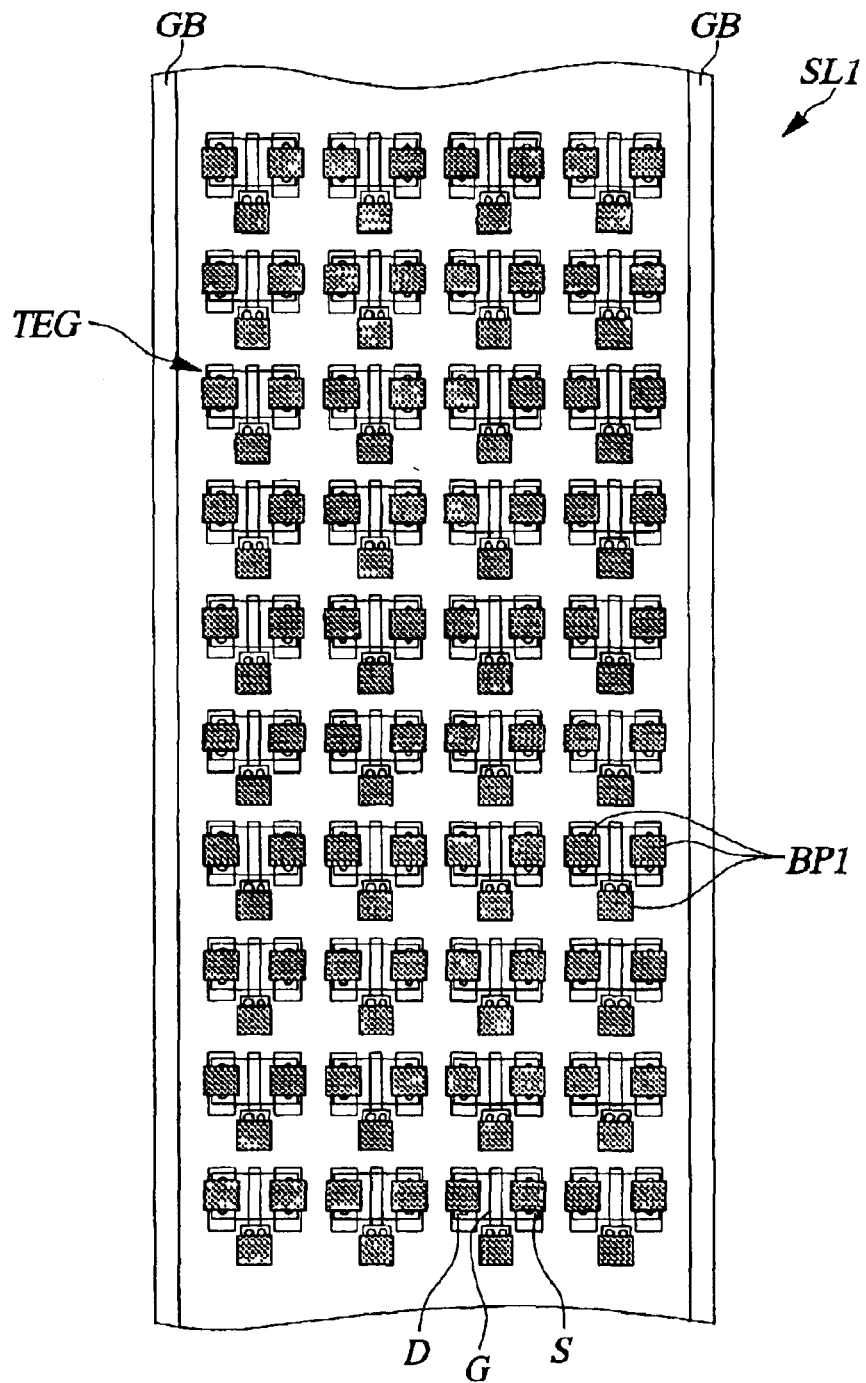
FIG. 3 is a plan view showing an example of the principal part of the plurality of TEGs and electrode pads arranged in a first scribe region.

FIG. 3 is a plan view showing an example of the principal part of the plurality of TEGs and first electrode pads BP1 arranged in the first scribe region SL1.

A TEG constituted of a MISFET (metal insulator semiconductor field effect transistor) is shown in the first scribe region SL1 sandwiched between the adjacent guard bands GB as an example. The first electrode pad BP1 (represented by a half-tone dot meshing in FIG. 3) is connected to each of a gate G, a source S, and a drain D of the MISFET. The first electrode pad BP1 is a minute rectangular electrode having a side length of 0.5 $\mu$m or shorter and is constituted of the uppermost layer wiring on a semiconductor substrate, and each of the first electrode pads BP1 is an isolated pattern having no wire-connection with other electrodes. Since the first electrode pads BP1 are minute isolated patterns, a great number of TEGs can be laid in the first scribe region SL1.

The measurement of the TEG is performed, for example, by contacting the nanoprobe to the first electrode pad BP1 while observing them using the scanning electron microscope. This nanoprobe is made of tungsten, and the tip portion thereof can be processed to obtain a desired radius of curvature by an electropolishing method.

Note that, though the shape of the first electrode pad BP1 is a rectangle having a side length of 0.5 $\mu$m or shorter in this embodiment, the dimensions of the first electrode pad BP1 can be selected depending on the shape or the dimensions of the TEG arranged in the first scribe region SL1. For example, the first electrode pad BP1 in the shape of a rectangle having a side length of 1 $\mu$m or shorter may be employed. Alternatively, the first electrode pad BP1 in the shape of a rectangle having a side length of 10 $\mu$m or shorter may be employed.

Figure 4:
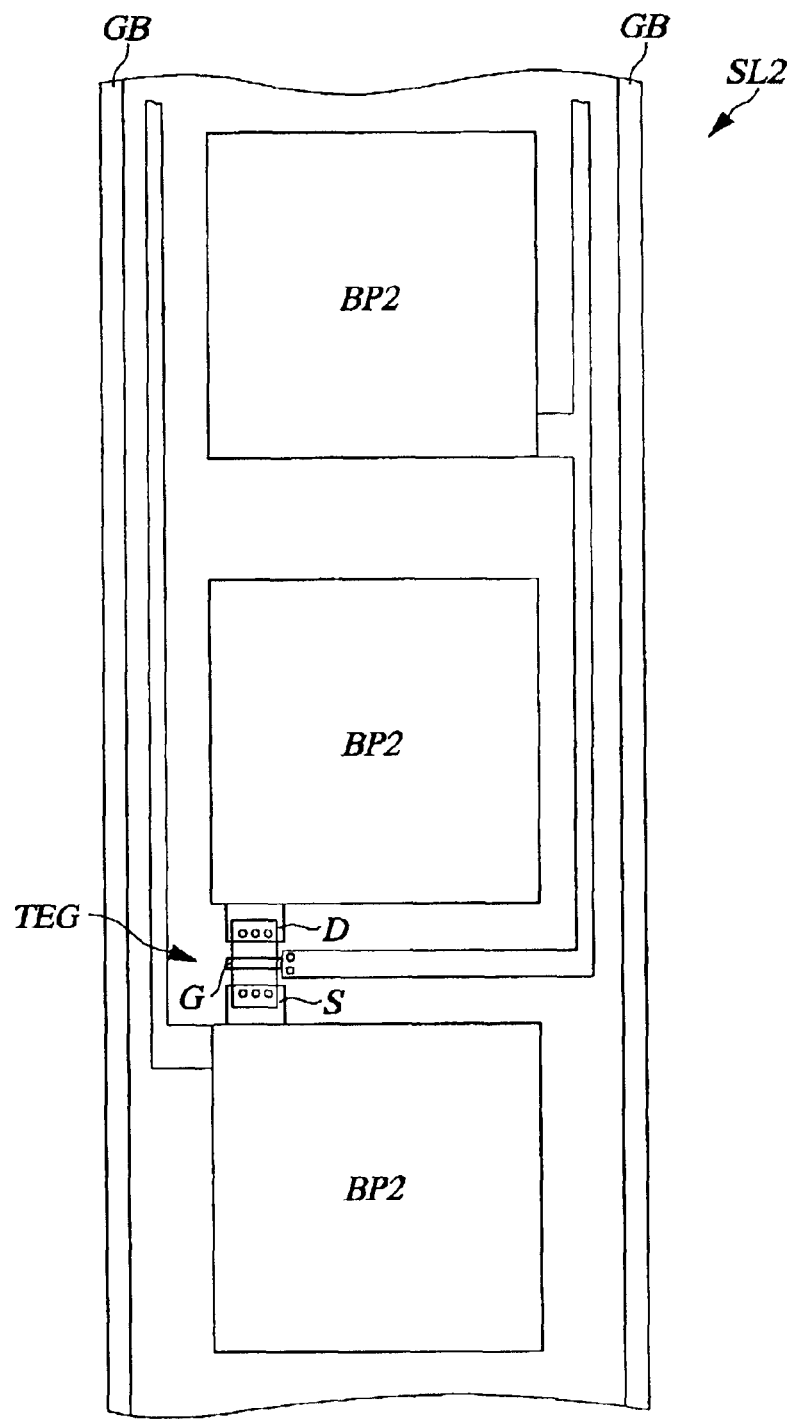
FIG. 4 is a plan view showing an example of the principal part of an arrangement region of the TEG and a plurality of electrode pads arranged in a second scribe region.

FIG. 4 is a plan view showing an example of the principal part of the TEGs and a plurality of second electrode pads BP2 arranged in the second scribe region SL2.

In the second scribe region SL2, a TEG constituted of a MISFET is shown as an example. The measurement of the TEG can be performed using an apparatus provided with a probe capable of its alignment with the TEG easily by an optical microscope and capable of making electrical contact surely to the TEG. In other words, a second electrode pad BP2, which is a rectangular electrode having a side length of 20 μm or longer, for example about 80 μm, and is constituted of the uppermost layer wiring on the semiconductor substrate, is connected to each of a gate G, a source S, and a drain D of the MISFET constituting the TEG. The second electrode pads BP2 occupy about 70% of the second scribe region SL2.

Figure 5:
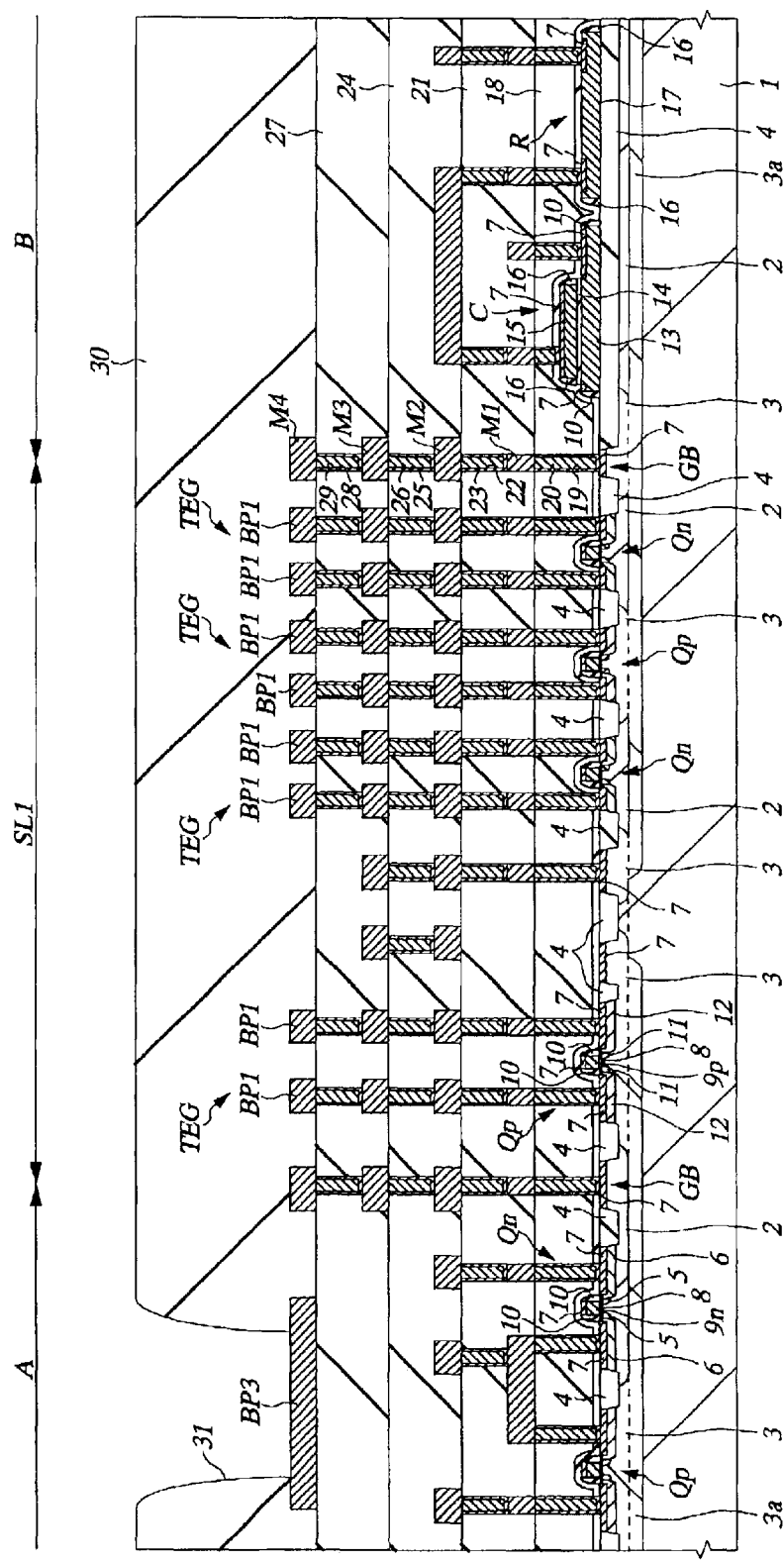
FIG. 5 is a cross-sectional view showing an example of the principal part of a semiconductor substrate illustrating the TEG arranged in the first scribe region.

FIG. 5 is a cross-sectional view showing an example of the principal part of a semiconductor substrate illustrating the TEG in the first scribe region SL1.

The first scribe region SL1 is sandwiched between the adjacent guard bands GB. For example, a MOS (metal oxide semiconductor) circuit is formed in a product circuit region A near one of the guard bands GB, and a capacitor element C and a resistive element R are formed in a product circuit region B near the other of the guard bands GB. A plurality of the TEGs constituted of the MISFET are arranged in the first scribe region SL1, and a region enclosed by an element isolation region provided on a main surface of the semiconductor substrate can be taken as one TEG region. Note that, in this embodiment, the MISFET is shown as an example of the TEG arranged in the first scribe region SL1, however, it is also possible to constitute the TEG using other circuit elements required for the evaluation.

For example, a p well 2 and an n wells 3 and 3a are formed on a main surface of a semiconductor substrate 1 made of p type single crystal. The n well 3 is a well formed in a relatively shallow region and the n well 3a is a buried well formed in a relatively deep region, which are formed in order to prevent the intrusion of the noise from, for example, an input/output circuit through the semiconductor substrate 1.

An n channel MISFET Qn and a p channel MISFET Qp are formed in the first scribe region SL1 and the product circuit region A, and these MISFETs are isolated from each other by an element isolation insulating film 4.

The n channel MISFET Qn is formed in an active region enclosed by the element isolation insulating film 4. The p well 2 is formed in the active region on the semiconductor substrate 1, and a source and a drain made of a pair of $n^-$ type semiconductor regions 5 and a pair of $n^+$ type semiconductor region 6 are formed on a surface of the p well 2. A silicide layer 7 is formed on a surface of the pair of $n^+$ type semiconductor regions 6 by a self-alignment silicide technique. The silicide layer 7 is made of, for example, titanium (Ti) silicide, cobalt (Co), silicide, or the like. Moreover, a gate insulating film 8 constituted of, for example, a silicon oxide film is formed on the p well 2 between the pair of $n^-$ type semiconductor regions 5, and a gate electrode 9n is formed thereon, which is made of a polycrystalline silicon film having impurities introduced therein. The silicide layer 7 is provided on an upper surface of the gate electrode 9n, and a sidewall spacer 10 made of, for example, a silicon oxide film is provided on a sidewall of the gate electrode 9n.

Similarly, the p channel MISFET Qp is formed in the active region enclosed by the element isolation insulating film 4. The n well 3 is formed in the active region on the semiconductor substrate 1, and a source and a drain made of a pair of $p^-$ type semiconductor regions 11 and a pair of $p^+$ type semiconductor regions 12 are formed on the surface of the n well 3. The silicide layer 7 is formed on a surface of the pair of $p^+$ type semiconductor regions 12. Moreover, the gate insulating film 8 constituted of, for example, a silicon oxide film is formed on the n well 3 between the pair of $p^-$ type semiconductor regions 11, and a gate electrode 9p is formed thereon, which is made of a polycrystalline silicon film having impurities introduced therein. The silicide layer 7 is provided on an upper surface of the gate electrode 9p, and the sidewall spacer 10 made of, for example, a silicon oxide film is provided on a sidewall of the gate electrode 9p.

The capacitor element C is formed on the element isolation insulating film 4. A lower electrode 13 constituting the capacitor element C is constituted of a conductive film in the same layer as the polycrystalline silicon film which constitutes the gate electrode 9n of the n channel MISFET Qn and the gate electrode 9p of the p channel MISFET Qp, and the sidewall spacer 10 is formed on a sidewall of the lower electrode 13. The silicide layer 7 is formed on a part of the upper surface of the lower electrode 13. Moreover, an upper electrode 15 is formed on the lower electrode 13 via a capacitor insulating film 14. The capacitor insulating film 14 is made of a layered film made by depositing, for example, a silicon oxide film and a silicon nitride film in the order from below, and the upper electrode 15 is constituted of a polycrystalline silicon film having impurities introduced therein. The silicide film 7 is provided on an upper surface of the upper electrode 15, and a sidewall spacer 16 made of, for example, a silicon oxide film is provided on a sidewall of the upper electrode 15.

The resistive element R is formed on the element isolation insulating film 4. A resistive body 17 of the resistive element R is constituted of a conductive film in the same layer as the polycrystalline silicon film which constitutes the upper electrode 15 of the capacitor element C. The silicide layer 7 is provided on a part of the upper surface of the resistive body 17, and the sidewall spacer 16 is provided on a sidewall of the resistive body 17.

Furthermore, a wiring having a four-layered structure is formed on the n channel MISFET Qn, P channel MISFET Qp, the capacitor element C, and the resistive element R. Note that, though a four-layered wiring is exemplified in FIG. 5, multi-layered wiring such as five or more layered wiring and three or less layered wiring may be employed.

A first wiring layer M1 is formed on a first interlayer insulating film 18, constituted of, for example, a silicon oxide film, and is connected to the source and the drain of the n channel MISFET Qn, the source and the drain of the p channel MISFET Qp, the lower electrode 13 of the capacitor element C, the upper electrode 15, and the resistive body 17 of the resistive element R via a plug 20 buried in a connection hole 19 formed in the necessary portion of the first interlayer insulating film 18, respectively. Note that, though not shown in FIG. 5, the first wiring layer M1 is also connected to the gate electrode 9n of the n channel MISFET Qn and the gate electrode 9p of the p channel MISFET Qp. The plugs 20 and the first wiring layer M1 are made of, for example, tungsten, respectively.

A second wiring layer M2 is formed on a second interlayer insulating film 21 constituted of, for example, a silicon oxide film and is connected to the first wiring layer M1 via a plug 23 buried in a connection hole 22 formed in the necessary portion of the second interlayer insulating film 21. The plugs 23 are each made of, for example, a barrier metal layer and a copper film serving as a main conductive layer. The barrier metal layer functions to prevent the dispersion of the copper, (Cu) as the main component of the wiring and a connection member and also functions to improve adhesiveness between the copper and the insulating film. The barrier metal layer is made of, for example, titanium nitride (TiN), tantalum (Ta), or tantalum nitride (TaN). The second wiring layer M2 is made of, for example, a barrier metal layer and a copper film serving as a main conductive layer. The second wiring layer M2 can be created by, for example, a so-called single damascene method in which wiring metal is buried in a trench formed in the second interlayer insulating film 21, and then a superfluous metal outside the trench is removed by using the CMP (chemical mechanical polishing) method.

A third wiring layer M3 is formed on a third interlayer insulating film 24, constituted of, for example, a silicon oxide film, and is connected to the second wiring layer M2 via a plug 26 buried in a connection hole 25 formed in the necessary portion of the third interlayer insulating film 24. Similarly to the plug 23, the plug 26 is made of a barrier metal layer and a copper film serving as a main conductive layer. Similarly to the second wiring layer M2, the third wiring layer M3 is made of, for example, the barrier metal layer and the copper film serving as the main conductive layer.

A fourth wiring layer M4 is formed on a fourth interlayer insulating film 27 constituted of, for example, a silicon oxide film and is connected to the third wiring layer M3 via a plug 29 buried in a connection hole 28 formed in the necessary portion of the fourth interlayer insulating film 27. The plug 29 is made of, for example, tungsten, and the fourth wiring layer M4 is made of, for example, aluminum. Furthermore, a passivation film (protection film) 30 for protecting the semiconductor integrated circuit covers almost entire surface of the semiconductor substrate 1.

The fourth wiring layer M4 as the uppermost layer wiring constitutes the first electrode pad BP1 in the first scribe region SL1 and a bonding pad BP3 for inputting/outputting a signal connected to the product circuit. The bonding pad BP3 can be arranged either in the central portion of the chip CP or the peripheral portion thereof. An opening hole 31 is formed in the passivation film 30 on the bonding pad BP3, and a part of a surface of the bonding pad BP3 is exposed so that it is connected to an outer terminal of a package. In the first scribe region SL1, however, the passivation film 30 is not removed and the first electrode pad BP1 in the first scribe region SL1 is covered with the passivation film 30. As described later, the passivation film 30 on the first electrode pad BP1 of the TEG used in the characteristic evaluation or the failure analysis is removed at the time of the measurement.

The first electrode pad BP1 is a rectangular electrode and a length of one side thereof is equivalent to a dimension obtained by adding a design dimension of a diameter of the connection hole 28 between the third wiring layer M3 and the fourth wiring layer M4 and the alignment margin between the fourth wiring layer M4 and the connection hole 28. For example, assuming that the hole diameter of the connection hole 28 is 0.15 $\mu$m (L), the length of one side of the first electrode pad BP1 is about 0.2 $\mu$m (L×4/3) in consideration of the alignment margin.

The guard band GB is made by laminating the plug 20, the first wiring layer M1, the plug 23, the second wiring layer M2, the plug 26, the third wiring layer M3, the plug 29, and the fourth wiring layer M4 in the order from below on the semiconductor substrate 1, and the guard band GB is provided in the periphery of the semiconductor integrated circuit.

Figure 6A:
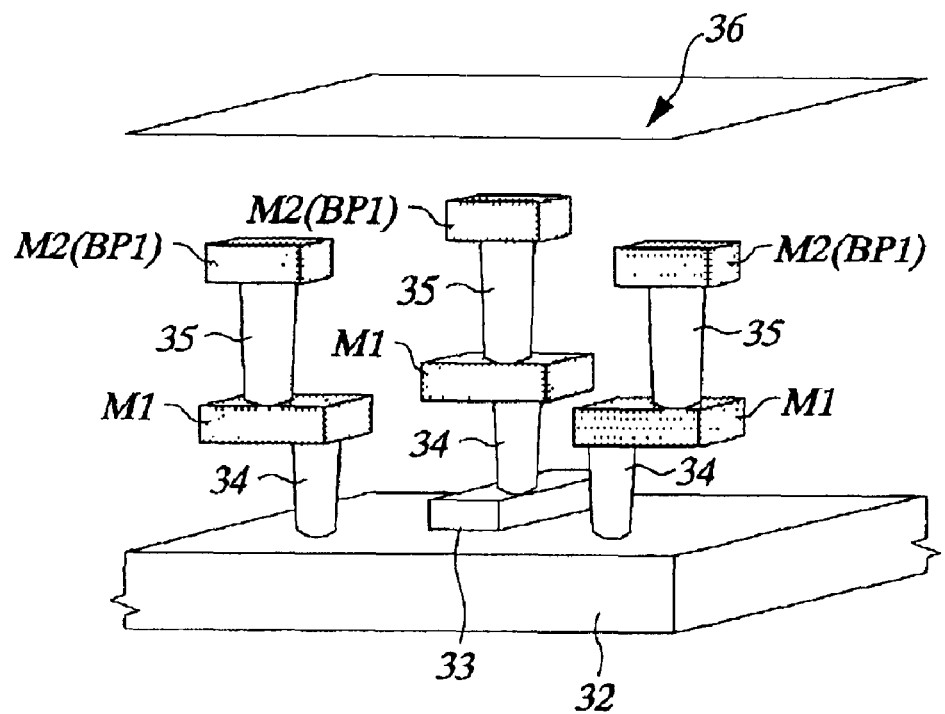
FIG. 6A is a schematic perspective view of the TEG.
Figure 6B:
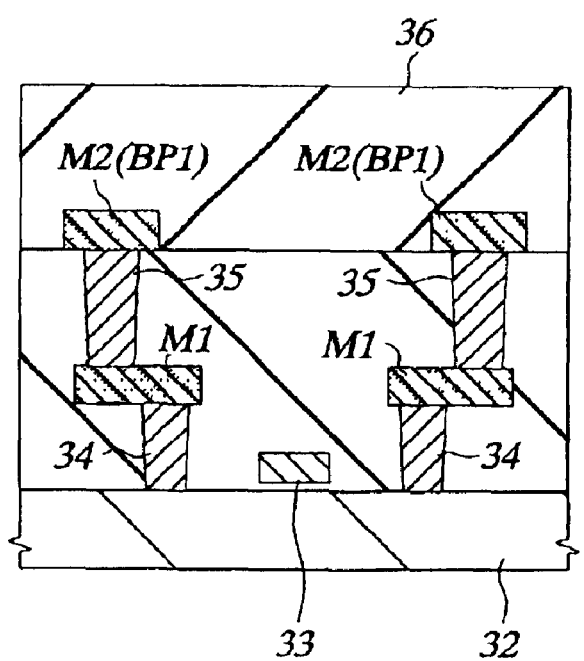
FIG. 6B is a schematic cross-sectional view of the TEG.

A part of the TEG arranged in the first scribe region SL1 is enlarged and shown in FIG. 6. FIG. 6A is a schematic perspective view of the TEG, and FIG. 6B is a schematic cross-sectional view of the TEG, in which the TEG constituted of a MISFET and having the wiring of a two-layered structure is exemplified.

A gate 33, a source, and a drain of the MISFET provided on a semiconductor substrate 32 are connected to the first wiring layer M1 via a plug 34. Moreover, the first wiring layer M1 is connected to the second wiring layer M2 serving as the uppermost layer wiring via a plug 35. The second wiring layer M2 constitutes the first electrode pad BP1 of the TEG used in the characteristic evaluation or the failure analysis, and the surface of the second wiring layer M2 is covered with a passivation film 36. In addition, the one first electrode pad BP1 constituted of the second wiring layer M2 is an independent pattern, which is connected to one plug 35 but not wire-connected to a plurality of the plugs 35.

Figure 7:
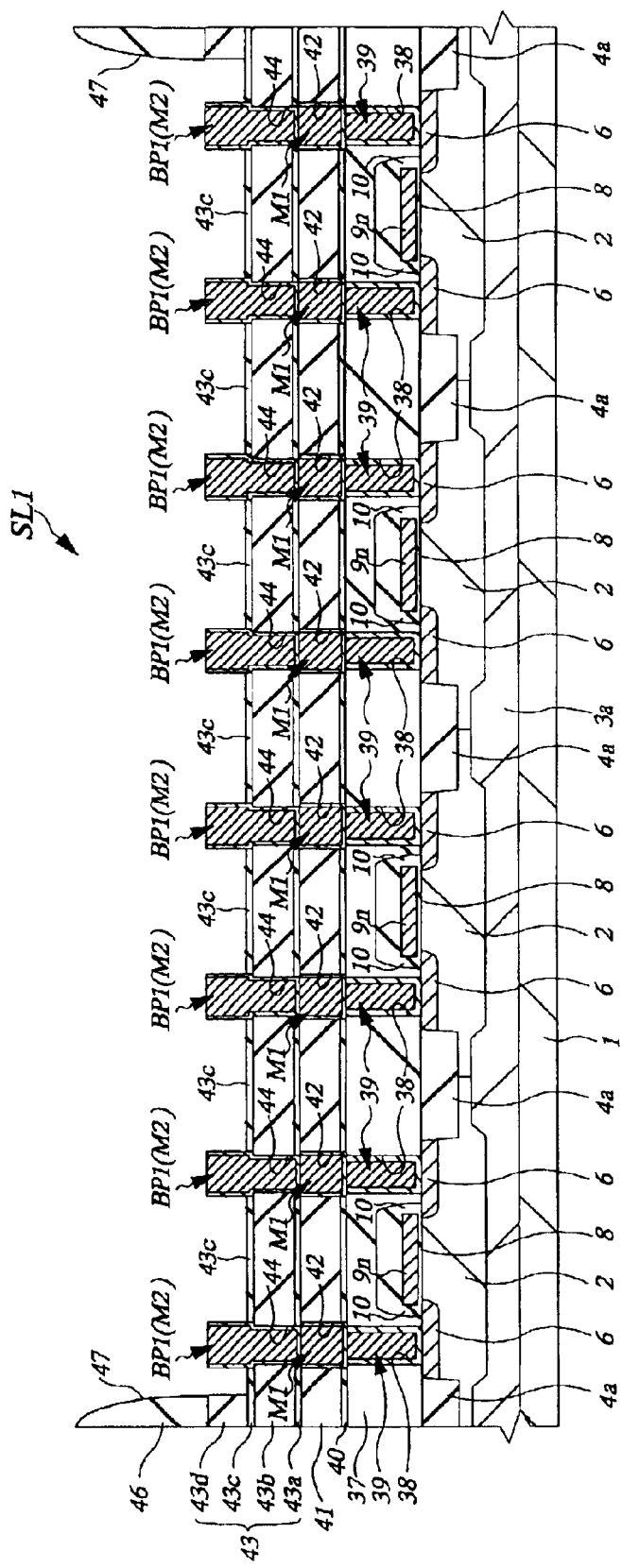
FIG. 7 is a cross-sectional view showing another example of the principal part of a semiconductor substrate illustrating the TEG arranged in the first scribe region.

FIG. 7 is a cross-sectional view showing another example of the principal part of a semiconductor substrate illustrating the TEG in the first scribe region SL1. In FIG. 7, a plurality of TEGs, which are constituted of the n channel MISFET arranged in the first scribe region SL1 and have a wiring of a two-layered structure are shown. Note that, though the n channel MISFET is exemplified as the TEG arranged in the first scribe region SL1 in FIG. 7, the TEG may be constituted of other circuit elements required for the evaluation.

Similarly to the first scribe region SL1 shown in FIG. 5, the region enclosed by the element isolation region 4a provided on the main surface of the semiconductor substrate 1 can be taken as the region of one TEG. Since the MISFET formed in the first scribed region SL1 has approximately the same structure as that of the n channel MISFET Qn described in FIG. 5, the descriptions thereof will be omitted.

The first wiring layer M1 is formed on a first interlayer insulating film 37 constituted of, for example, a silicon oxide film, and is connected to a source and a drain of the n channel MISFET via a plug 39 buried in a connection hole 38 formed in the necessary portion of the first interlayer insulating film 37. The plug 39 is made of, for example, tungsten.

The first wiring layer M1 is buried in a wiring trench 42 formed in a stopper insulating film 40 on the upper layer of the plug 39 and an insulating film 41 for forming a wiring, that is, a so-called single damascene wiring can be employed. The first wiring layer M1 is made of, for example, tungsten. The stopper insulating film 40 serves as an etching stopper in a process for forming a trench in the insulating film 41, and a material having an etching selectivity to the insulating film 41 is used thereto. The stopper insulating film 40 is made of, for example, a silicon nitride film, and the insulating film 41 is made of, for example, a silicon oxide film.

A so-called dual damascene wiring in which the same member is buried in both of a connection hole 44 and a wiring trench (not shown) formed in a second interlayer insulating film 43 on the upper layer of the first wiring layer M1 can be employed to the second wiring layer M2. The second wiring layer M2 is made of, for example, a barrier metal layer and a copper film as a main conductive layer, and the barrier metal layer is made of, for example, titanium nitride, tantalum, or tantalum nitride.

The second interlayer insulating film 43 is constituted of a layered film formed by depositing, in the order from below, a cap insulating film 43a, a first insulating film 43b, a stopper insulating film 43c for forming a wiring, and a second insulating film 43d for forming a wiring. A connection hole 44 extending to the first wiring layer M1 is formed in the cap insulating film 43a and the first insulating film 43b, and a wiring trench in which the second wiring layer M2 is buried is formed in the stopper insulating film 43c and the second insulating film 43d.

The cap insulating film 43a is constituted of a material having an etching selectivity to the first insulating film 43b, for example, a silicon nitride film. The first insulating film 43b is made of, for example, a silicon oxide film. Also, the stopper insulating film 43c is constituted of a material having an etching selectivity to the first insulating film 43b or the second insulating film 43d, for example, a silicon nitride film. The second insulating film 43d is made of, for example, a silicon oxide film. Moreover, the stopper insulating film 43c functions also as an etching stopper layer of a passivation film 46 deposited on the upper layer of the second wiring layer M2.

The first electrode pad BP1 in the first scribe region SL1 is constituted of the second wiring layer M2 as the uppermost layer wiring. A opening hole 47 is widely formed in the passivation film 46 on the first scribe region SL1, and the second insulating film 43d for forming a wiring is also removed when the passivation film 46 is etched, and thus the first electrode pads BP1 are exposed in the island shape.

Figure 8:
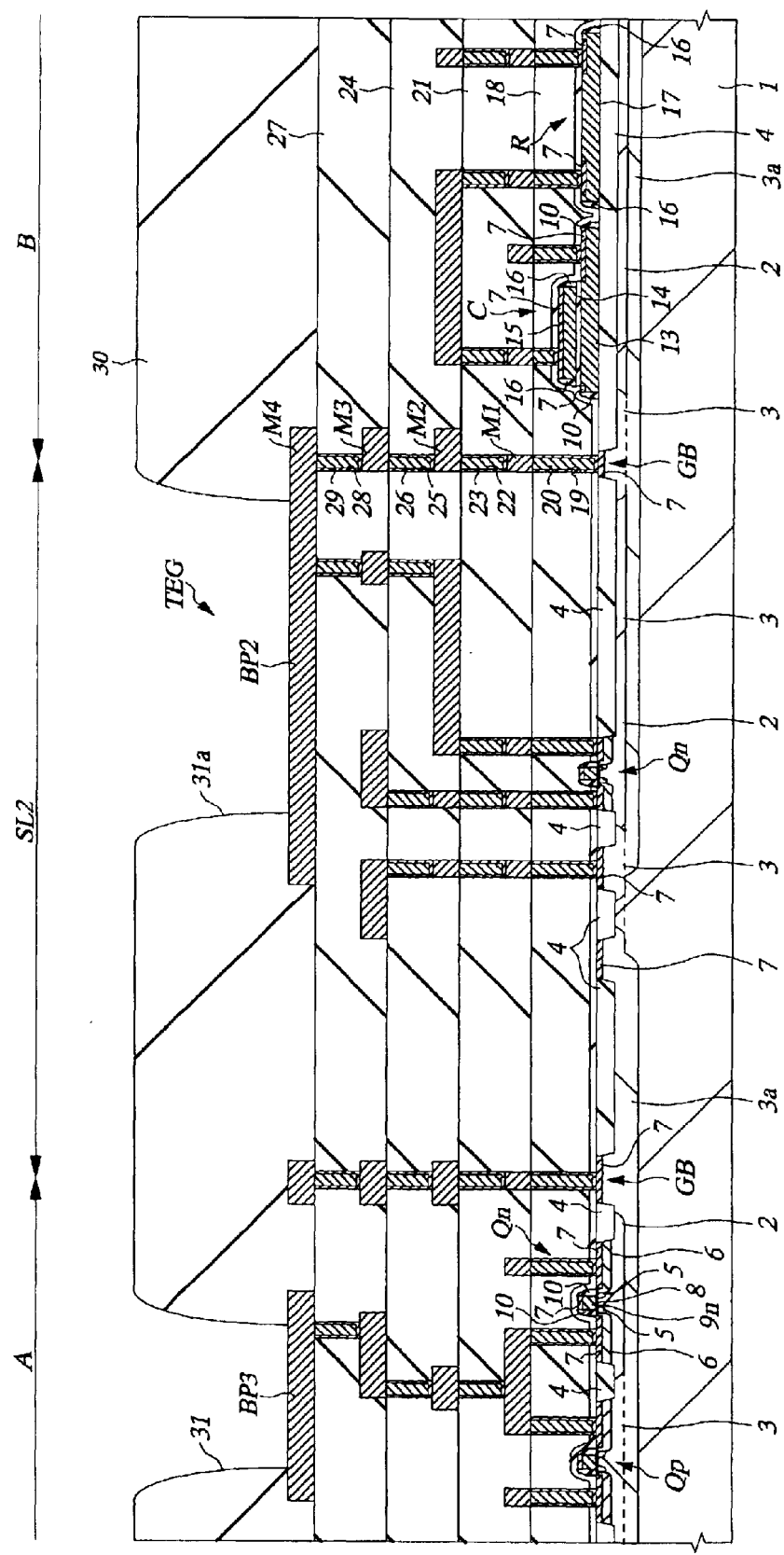
FIG. 8 is a cross-sectional view showing an example of the principal part of a semiconductor substrate illustrating the TEG arranged in the second scribe region.

FIG. 8 is a cross-sectional view showing an example of the principal part of a semiconductor substrate illustrating the TEG in the second scribe region SL2.

Similarly to the first scribe region SL1, the second scribe region SL2 is sandwiched between the adjacent guard bands GB. For example, a MOS circuit is formed in a product circuit region A near one of the guard bands GB, and a capacitor element C and a resistive element R are formed in a product circuit region B near the other of the guard bands GB. The TEG constituted of the n channel MISFET Qn is arranged in the second scribe region SL2. Note that, though the n channel MISFET Qn is exemplified as the TEG arranged in the second scribe region SL2 in FIG. 8, the TEG may be constituted of other circuit elements required for the evaluation. In addition, though a four-layered wiring is exemplified, multi-layered wiring such as five or more layered wiring and three or less layered wiring may be employed.

The first wiring layer M1, the second wiring layer M2, and the third wiring layer M3 formed in the second scribe region SL2 are approximately the same as the first wiring layer M1, the second wiring layer M2, and the third wiring layer M3 formed in the first scribe region SL1, respectively. Therefore, the description thereof will be omitted.

The fourth wiring layer M4 serving as the uppermost layer wiring constitutes the second electrode pad BP2 in the second scribe region SL2 and the bonding pad BP3 for inputting/outputting a signal connected to the product circuit. The bonding pad BP3 can be arranged either in the central portion of the chip CP or the peripheral portion thereof. The opening hole 31 is formed in the passivation film 30 on the bonding pad BP3, and a part of a surface of the bonding pad BP3 is exposed so that it is connected to an outer terminal of the package.

Similarly, an opening hole 31a is formed also in the passivation film 30 on the second electrode pad BP2 arranged in the second scribe region SL2, and a part of the surface of the second electrode pad BP2 is exposed. The opening hole 31a on the second electrode pad BP2 and the opening hole 31 on the bonding pad BP3 are formed by the same lithography process and the etching process.

Figure 9A:
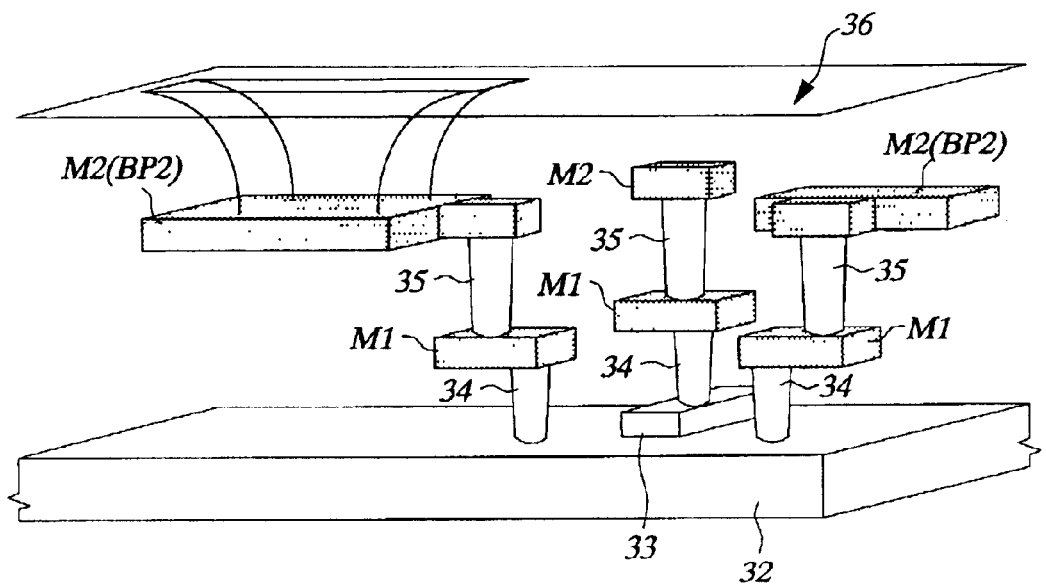
FIG. 9A is a schematic perspective view of the TEG.
Figure 9B:
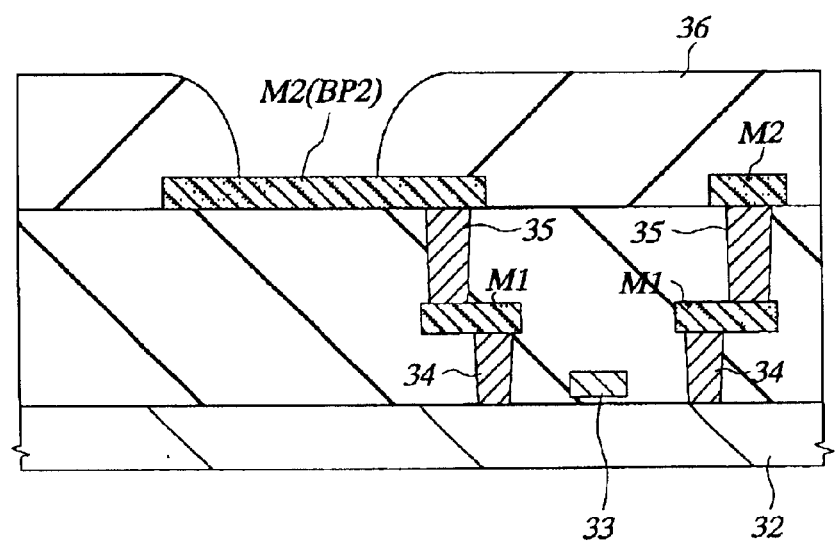
FIG. 9B is a schematic cross-sectional view of the TEG.

A part of the TEG arranged in the second scribe region SL2 is enlarged and shown in FIG. 9. FIG. 9A is a schematic perspective view of the TEG, and FIG. 9B is a schematic cross-sectional view of the TEG, in which the TEG constituted of a MISFET and having the wiring of a two-layered structure is exemplified.

A gate 33, a source, and a drain of the MISFET provided on the semiconductor substrate 32 are connected to the first wiring layer M1 via the plug 34. Moreover, the first wiring layer M1 is connected to the second wiring layer M2 serving as the uppermost layer wiring via the plug 35. The second wiring layer M2 constitutes the second electrode pad BP2 of the TEG used in the characteristic evaluation or the failure analysis, and a part of the surface of the second electrode pad BP2 is exposed by making a hole in the passivation layer 36. Also, one second electrode pad BP2, constituted of the second wiring layer M2, may be connected to one plug 35 and, alternatively, may be connected to the plurality of the plugs 35. For example, the gates of the plurality of the MISFETs may be connected to the one second electrode pad BP2 to constitute a second electrode pad BP2 having a common gate. Similarly, the sources of the plurality of the MISFETs may be connected to the one second electrode pad BP2 to constitute a second electrode pad BP2 having a common source.

Next, an example of a method for manufacturing the TEG in the first scribe region SL1 shown in FIG. 7 will be described referring to the process steps thereof in connection with cross-sectional views of FIGS. 10 to 14 showing the principal part of the semiconductor substrate.

Figure 10:
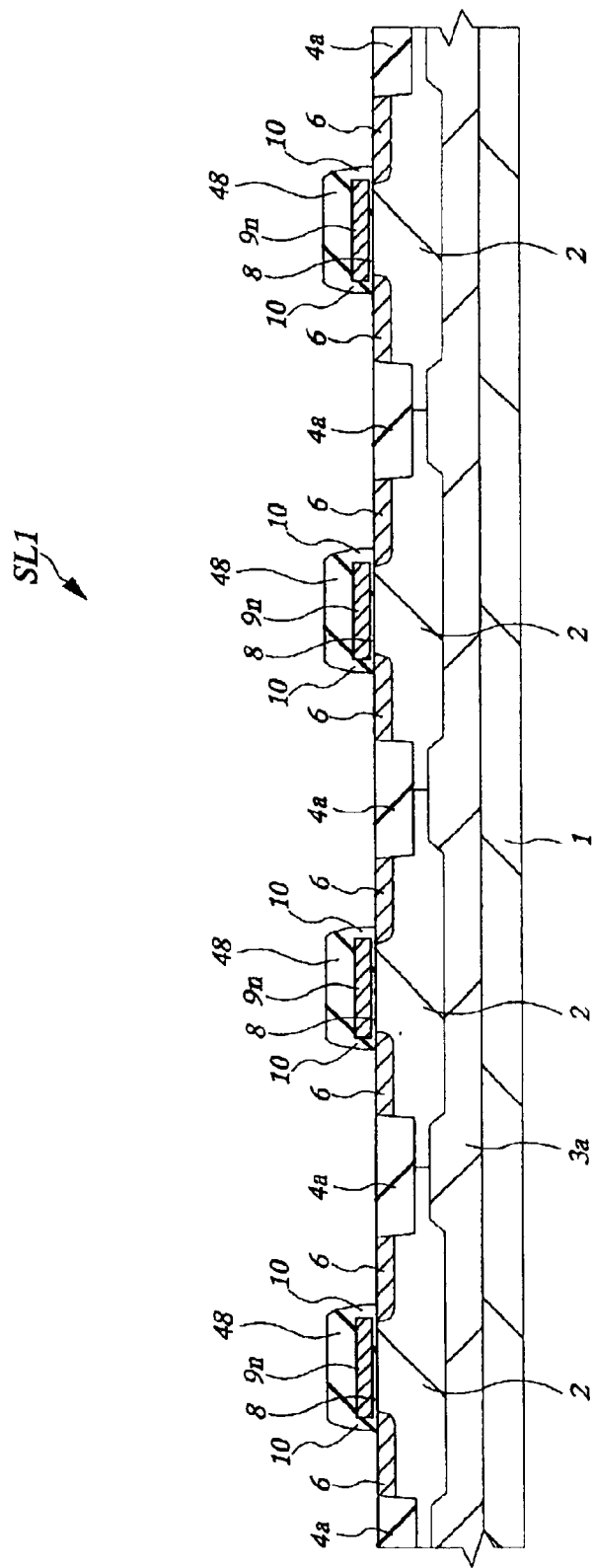
FIG. 10 is a cross-sectional view showing the principal part of the semiconductor substrate illustrating an early process step of a manufacturing method of the TEG arranged in the first scribe region.

First, as shown in FIG. 10, the semiconductor substrate 1 made of, for example, p type single crystal silicon is prepared, and then the element isolation region 4a is formed on a main surface of the semiconductor substrate 1. The element isolation region 4a can be formed in such a manner as follows. First, after a silicon oxide film and a silicon nitride film are sequentially formed on the main surface of the semiconductor substrate 1, the silicon nitride film is etched using a patterned photoresist film, and then a shallow trench is formed in the semiconductor substrate 1 with the etched silicon nitride film used as a mask. Thereafter, an insulating film to be buried in the shallow trench, for example, a silicon oxide film, is deposited, then the silicon oxide film outside the shallow trench is removed by the CMP method or the like and, further, the silicon nitride film is removed by the wet etching method or the like. As described above, the element isolation region 4a is formed.

Next, impurities are ion-injected with the patterned photoresist film used as a mask, thereby forming the p well 2 and the n well 3a. Impurities showing p type conductivity, for example, boron (B) are ion-injected to the p well 2, and impurities showing n type conductivity, for example, phosphorus (P) are ion-injected to the n well 3a. Impurities for controlling a threshold value of the MISFET may be ion-injected to each well region after that.

Subsequently, after sequentially depositing a silicon oxide film serving as a gate insulating film 8, a polycrystalline silicon film serving as a gate electrode 9n, to which n type impurities are ion-injected, and a silicon oxide film serving as a cap insulating film 48, these films are sequentially etched with the patterned photoresist film used as a mask. By doing so, the gate insulating film 8, the gate electrode 9n, and the cap insulating film 48 are formed. It is possible to form the gate insulating film 8 by, for example, the CVD (chemical vapor deposition) method, and, also, it is possible to form the gate electrode 9n by the CVD method.

Next, after depositing a silicon oxide film on the resultant structure on the semiconductor substrate 1 by, for example, the CVD method, the anisotropic etching is performed to the silicon oxide film, thereby forming the sidewall spacer 10 on a sidewall of the gate electrode 9n. Thereafter, n type impurities (e. g., phosphorus or arsenic (As)) are ioninjected to the p well 2 with the photoresist film used as a mask, thereby forming the $n^+$ type semiconductor regions 6 on the both sides of the gate electrode 9n on the p well 2. The $n^+$ type semiconductor regions 6 are formed self-alignlingly to the gate electrode 9n and the sidewall spacer 10. Also, the $n^+$ type semiconductor regions 6 function as a source and a drain of the n channel MISFET.

Note that a so-called LDD (lightly doped drain) structure is also applicable, which is obtained by forming a relatively low-concentration n⁻ type semiconductor region 5 before forming the sidewall spacer 10 and forming a relatively high-concentration n⁺ type semiconductor region 6 after forming the sidewall spacer 10.

Also, a silicide layer may be selectively formed in the pair of n⁺ type semiconductor regions 6 constituting the surface of the gate electrode 9n, the source, and the drain of the n channel MISFET by depositing, for example, a cobalt film or a titanium film on the resultant structure on the semiconductor substrate 1 by the sputtering method and, subsequently, performing a heat treatment thereto. The silicide layer is made of, for example, titanium silicide or cobalt silicide. Note that, in this case, the cap insulating film 48 on the gate electrode 9n is not formed.

Figure 11:
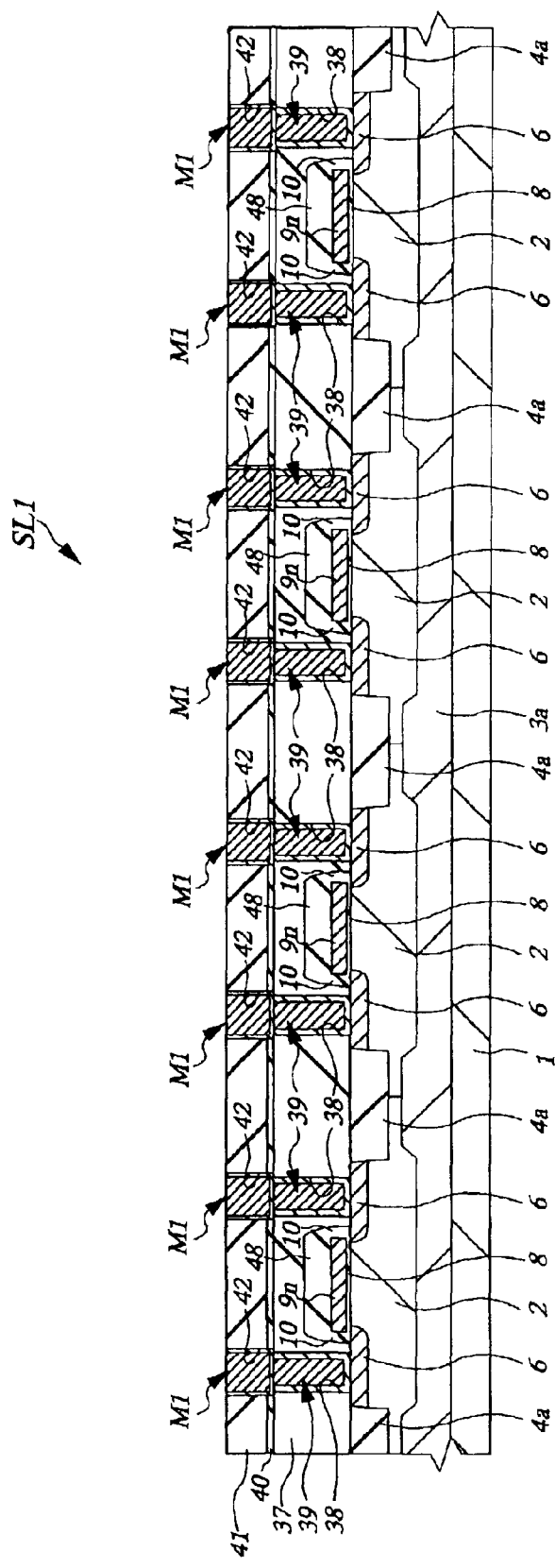
FIG. 11 is a cross-sectional view showing the principal part of the semiconductor substrate illustrating the manufacturing method of the TEG arranged in the first scribe region after a subsequent process step.

Next, as shown in FIG. 11, after depositing a silicon oxide film on the resultant structure on the semiconductor substrate 1 by the sputtering method or the CVD method, the silicon oxide film is polished by, for example, the CMP method, thereby forming the first interlayer insulating film 37 having a planarized surface. The first interlayer insulating film 37 may be formed as a layered film of, for example, a silicon nitride film, an SOG (spin on glass) film, a BPSG (boron phosphor silicate glass) film, a PSG (phosphor silicate glass) film and the like.

Next, the connection hole 38 is formed in the first interlayer insulating film 37 using the lithography and etching technique. The connection hole 38 is formed on the necessary portion, that is, on the n⁺ type semiconductor region 6 or on the gate electrode 9n.

Next, the plug 39 is formed in the connection hole 38 in such a manner as follows. First, a titanium nitride film is formed on the entire surface of the resultant structure on the semiconductor substrate 1 including the inside of the connection hole 38 by, for example, the CVD method, and a tungsten film to be buried in the connection hole 38 is formed by, for example, the CVD method. Thereafter, the titanium nitride film and the tungsten film in the region outside the connection hole 38 are removed by, for example, the CMP method, and thus the plug 39 is formed.

Next, the stopper insulating film 40 is formed on the first interlayer insulating film 37 and the plug 39, and an insulating film 41 for forming a wiring is also formed. The stopper insulating film 40 functions as an etching stopper in a process for forming a trench in the insulating film 41, and a material having an etching selectivity to the insulating film 41 is used thereto. The stopper insulating film 40 is made of, for example, a silicon nitride film, and the insulating film 41 is made of, for example, a silicon oxide film. Subsequently, the wiring trench 42 is formed in predetermined parts of the stopper insulating film 40 and the insulating film 41 using the lithography and etching technique.

Next, the first wiring layer M1 is formed in the wiring trench 42. The first wiring layer M1 is made of a tungsten film. The first wiring layer M1 is formed in such a manner as follows. First, a tungsten film is formed on the entire surface of the resultant structure on the semiconductor substrate 1 including the inside of the wiring trench 42. For example, the CVD method is used to form the tungsten film. Thereafter, the tungsten film in the region outside the wiring trench 42 is removed by, for example, the CMP method, and thus the first wiring layer M1 is formed.

Figure 12:
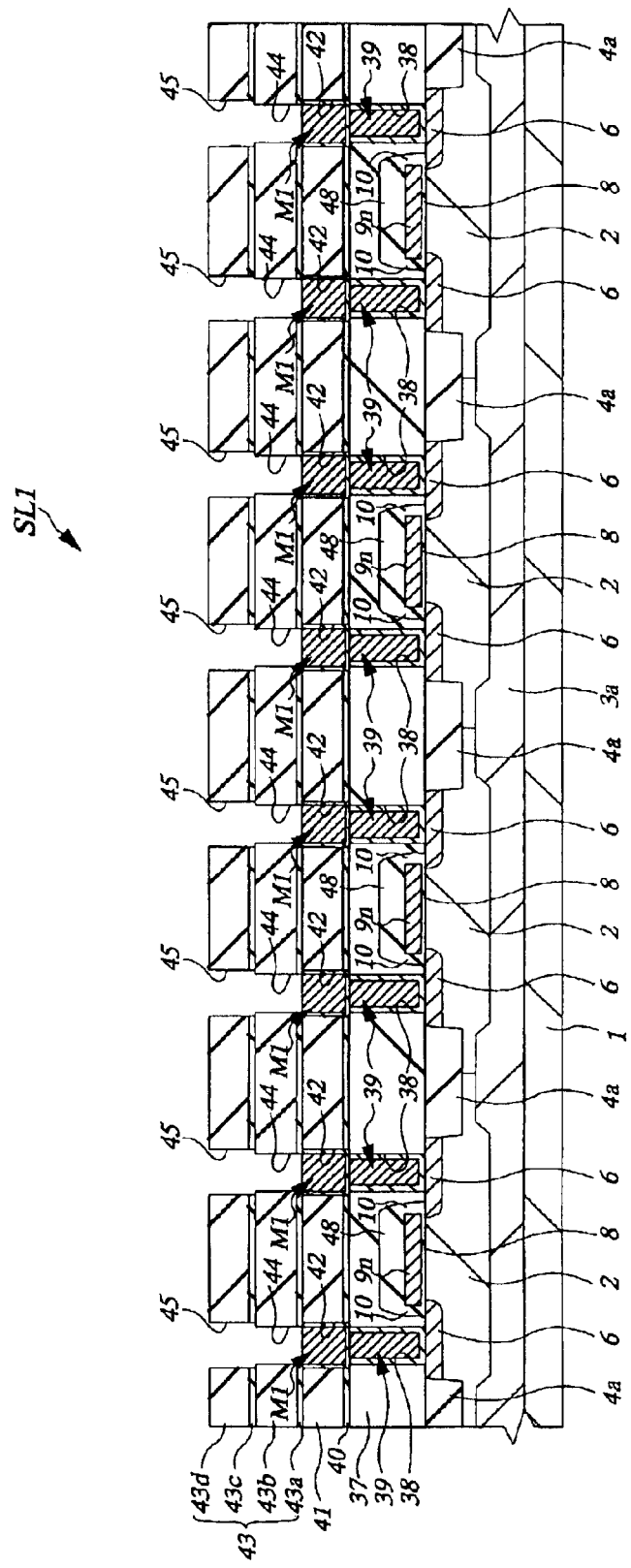
FIG. 12 is a cross-sectional view showing the principal part of the semiconductor substrate illustrating the manufacturing method of the TEG arranged in the first scribe region after a further process step.

Next, the second wiring layer M2 is formed by the dual damascene method. First, as shown in FIG. 12, the cap insulating film 43a, the first insulating film 43b, the stopper insulating film 43c for forming the wiring, and the second insulating film 43d for forming the wiring are sequentially formed on the insulating film 41 and the first wiring layer M1.

As described later, the connection hole 44 is formed in the cap insulating film 43a and the first insulating film 43b. The cap insulating film 43a is made of a material having an etching selectivity to the first insulating film 43b, for example, a silicon nitride film. The silicon nitride film is formed by, for example, the plasma CVD method. The first insulating film 43b is made of a silicon oxide film and is formed by, for example, the CVD method.

As described later, a wiring trench 45 is formed in the stopper insulating film 43c and the second insulating film 43d. The stopper insulating film 43c is constituted of a material having an etching selectivity to the second insulating film 43d, for example, a silicon nitride film. The silicon nitride film is formed by, for example, the plasma CVD method. The second insulating film 43d can be made of a TEOS (tetraethylorthosilicate: $Si(OC_2H_5)$) oxide film formed by, for example, the plasma CVD method in which TEOS gas and ozone ($O_3$) gas are used as source gases.

Next, the connection hole 44 is formed in the cap insulating film 43a and the first insulating film 43b, and the wiring trench 45 is formed in the stopper insulating film 43c and the second insulating film 43d. The connection hole 44 and the wiring trench 45 formed according to the dual damascene method are formed in such a manner as follows.

First, the second insulating film 43d, the stopper insulating film 43c, and the first insulating film 43b are sequentially etched with the photoresist film patterned to be a hole pattern used as a mask by, for example, the dry etching method. At this time, the cap insulating film 43a functions as an etching stopper layer. Subsequently, after removing the photoresist film, the second insulating film 43d is etched with the photoresist film patterned to be a trench pattern used as a mask by, for example, the dry etching method. At this time, the stopper insulating film 43c functions as an etching stopper layer. Thereafter, the exposed cap insulating film 43a is etched and removed.

Next, the second wiring layer M2 is formed in the connection hole 44 and the wiring trench 45. The wiring layer M2 is made of a barrier metal layer and a copper film serving as a main conductive layer, and a connection member for connecting the first wiring layer M1 and the second wiring layer M2 is formed together with the second wiring layer M2. For example, the method of forming the second wiring layer M2 is as follows.

Figure 13:
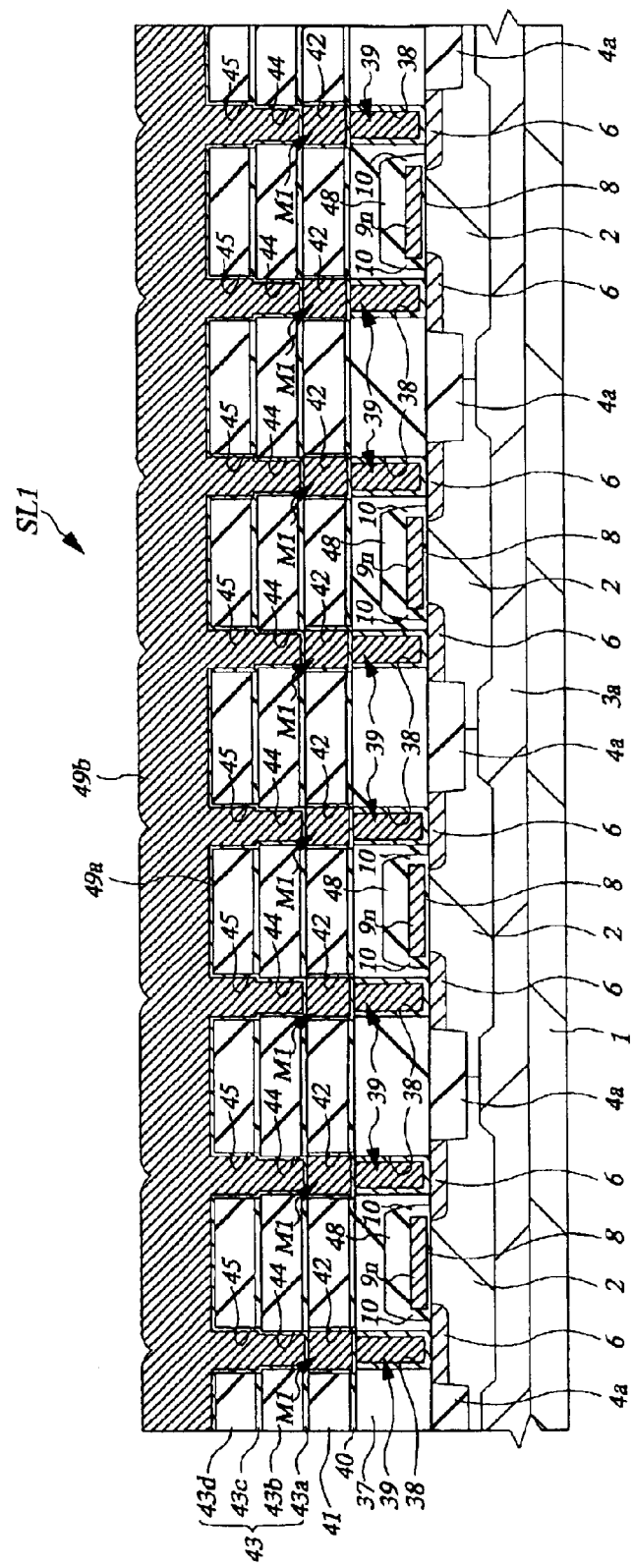
FIG. 13 is a cross-sectional view showing the principal part of the semiconductor substrate illustrating the manufacturing method of the TEG arranged in the first scribe region after a still further process step.

First, as shown in FIG. 13, a barrier metal layer 49a is formed on the entire surface of the resultant structure on the semiconductor substrate 1 including the insides of the connection hole 44 and the wiring trench 45. The barrier metal layer 49a is made of, for example, titanium nitride, tantalum, or tantalum nitride. Subsequently, after a seed layer (not shown) made of copper is formed on the barrier metal layer 49a by, for example, the CVD method or the sputtering method, a copper film 49b is formed by a plating method. Both of the electroplating method and the electroless plating method can be used as the plating method. Also, the copper film 49b can be formed by the sputtering method, not limited to the plating method. In this case, the seed layer is not required. In the case where the copper film 49b is formed by the sputtering method, the heat treatment is performed so as to reflow the copper into the connection hole 44 and the wiring trench 45 to bury the same.

Figure 14:
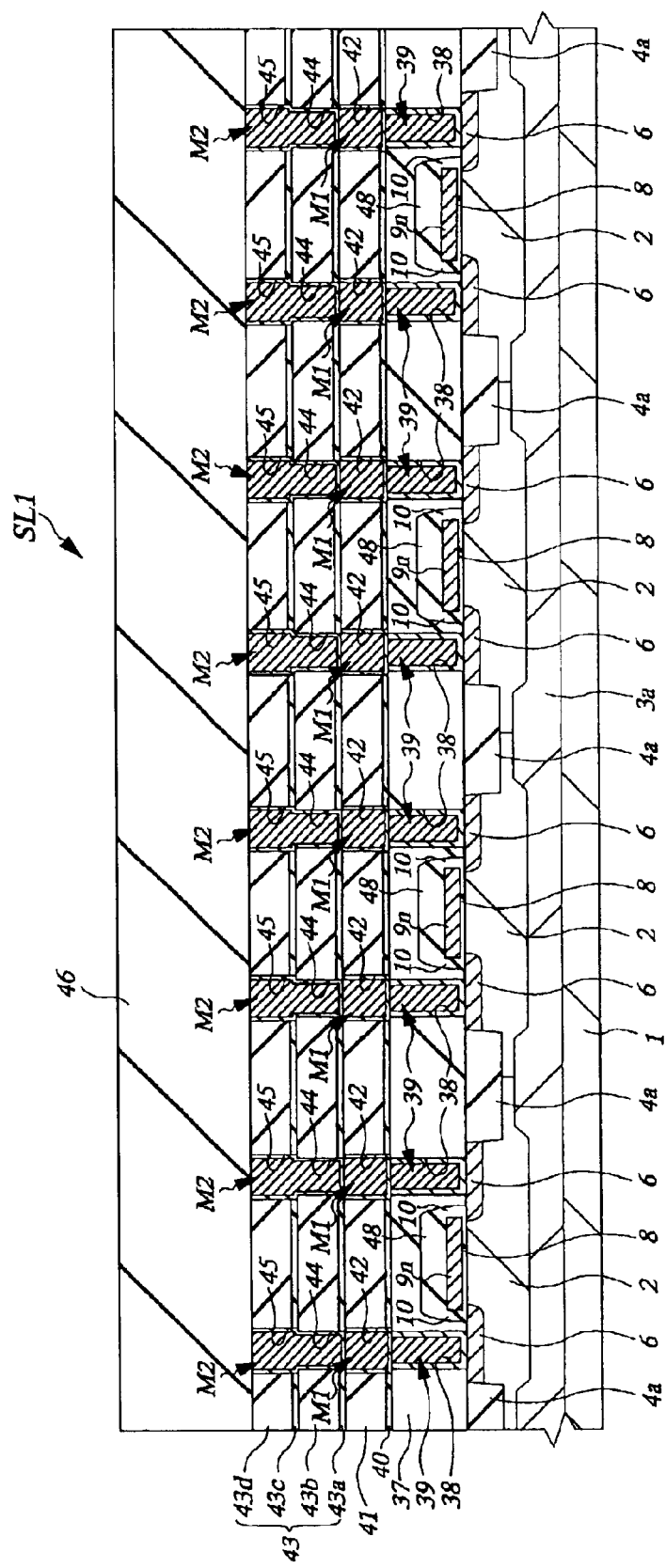
FIG. 14 is a cross-sectional view showing the principal part of the semiconductor substrate illustrating the manufacturing method of the TEG arranged in the first scribe region at a later process step.

Next, as shown in FIG. 14, the copper film 49b and the seed layer are polished using the CMP method. The copper portion is first removed due to a high polishing rate thereof.

The polishing is continued further, and the barrier metal layer 49a on the second insulating film 43d is also removed by the polishing. Thereby, the copper film 49b (including the seed layer) and the barrier metal layer 49a outside the wiring trench 45 are removed, and thus the second wiring layer M2 formed together with the connection member is formed. Thereafter, the entire surface of the resultant structure on the semiconductor substrate 1 is covered with a passivation film 46 made of, for example, a silicon oxide film. The silicon oxide film is formed by, for example, the plasma CVD method.

Next, the passivation film 46 in the first scribe region SL1 is removed using the lithography and etching technique, and at the same time, the second insulating film 43d is removed with the stopper insulating film 43c used as an etching stopper layer. By so doing, as shown in FIG. 7, the electrode pad BP1, which is constituted of the second wiring layer M2 exposed in the island shape, is formed in the first scribe region SL1.

Figure 15:
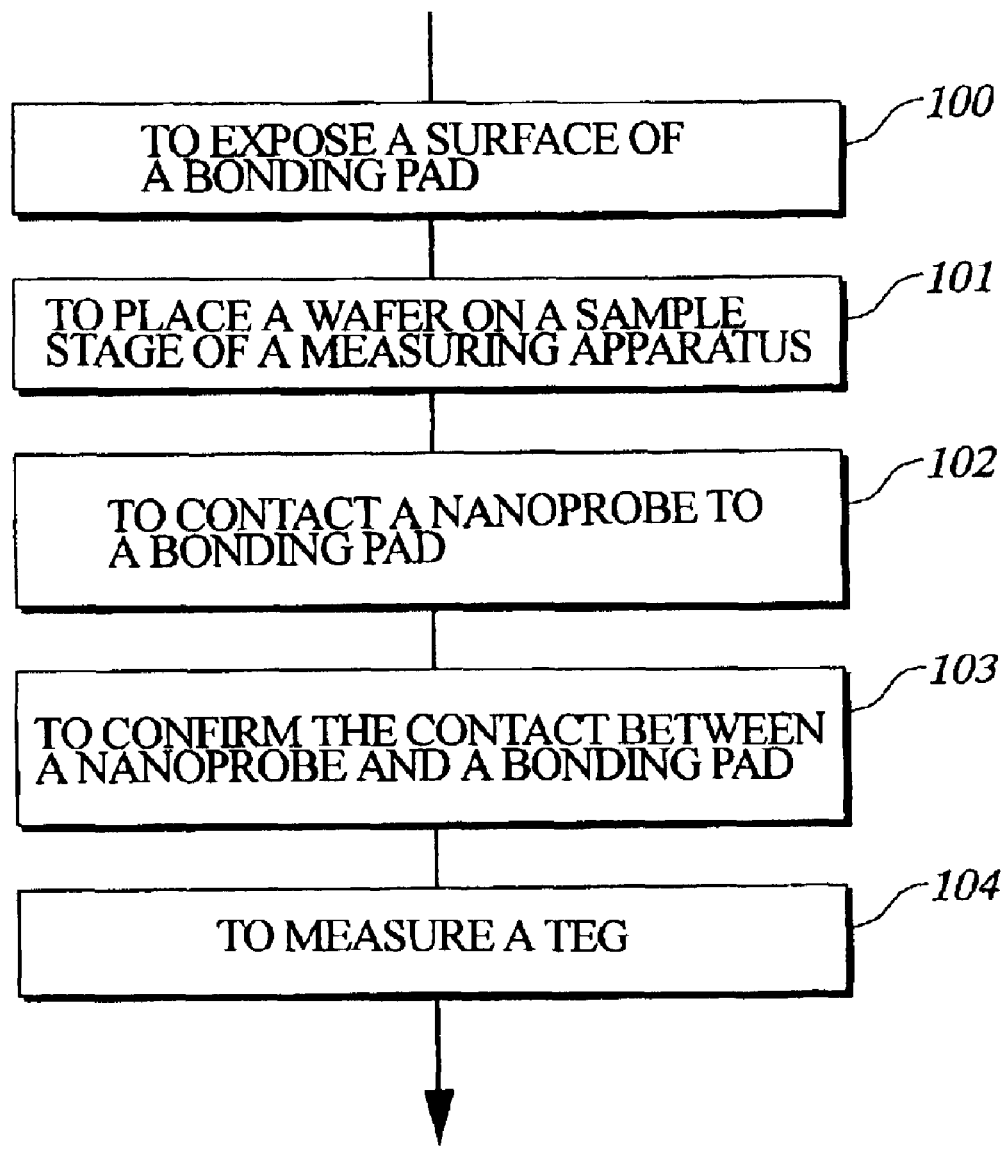
FIG. 15 is a flow chart for explaining the measuring method of the characteristics of the TEG.

Next, descriptions will be made for a method of measuring the electrical characteristics of the TEG arranged in the first scribe region SLI of the semiconductor device shown in FIG. 5 by referring to FIGS. 15 to 18. FIG. 15 is a flow chart for explaining the measuring method of the electrical characteristics of the TEG, FIG. 16 is an enlarged cross-sectional view of the semiconductor substrate showing a state where a part of a surface of the first electrode pad BP1 provided in the TEG is exposed, FIG. 17 is an enlarged cross-sectional view of the semiconductor substrate showing a state where a nanoprobe NP contacts to the first electrode pad BP1 provided in the TEG, and FIG. 18 is a schematic view of a measuring apparatus MS in which a plurality of independently movable nanoprobes NP are incorporated in a scanning electron microscope.

Figure 16:
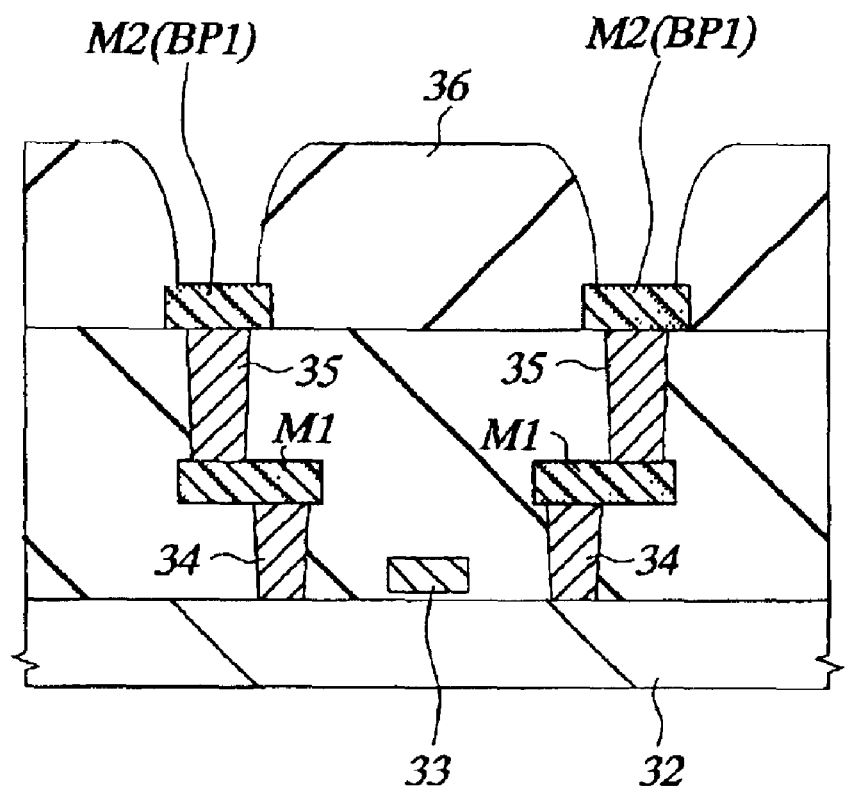
FIG. 16 is an enlarged cross-sectional view of the semiconductor substrate showing a state where a part of a surface of the electrode pad provided in the TEG is exposed.

First, as shown in FIG. 16, the passivation film 36 on the first electrode pad BP1 provided in the TEG to be measured is removed to expose a part of the surface of the first electrode pad BP1 (step 100 in FIG. 15). The passivation film 36 on the first electrode pad BP1 is removed by the focused ion beam (FIB) method or the reactive ion etching (RIE) method. According to the FIB method, for example, gallium ions are accelerated to about 30 keV and the ion beam is focused to a beam diameter of about 30 to 50 nm, and then the passivation film 36 is sputtered and removed using such ion beams. Note that, even if the first electrode pad BP1 is removed at the same time of the removal of the passivation film 36 on the first electrode pad BP1, the plug 35 to which the first electrode pad BP1 is connected serves as a substitute for the first electrode pad BP1, and thus the characteristic measurement of the TEG can be performed.

Note that, in the semiconductor device shown in FIG. 7, the passivation film 46 on the first scribe region SL1 is already removed and the surface of the first electrode pad BP1 is exposed. Therefore, the step 100 is omitted.

Figure 17:
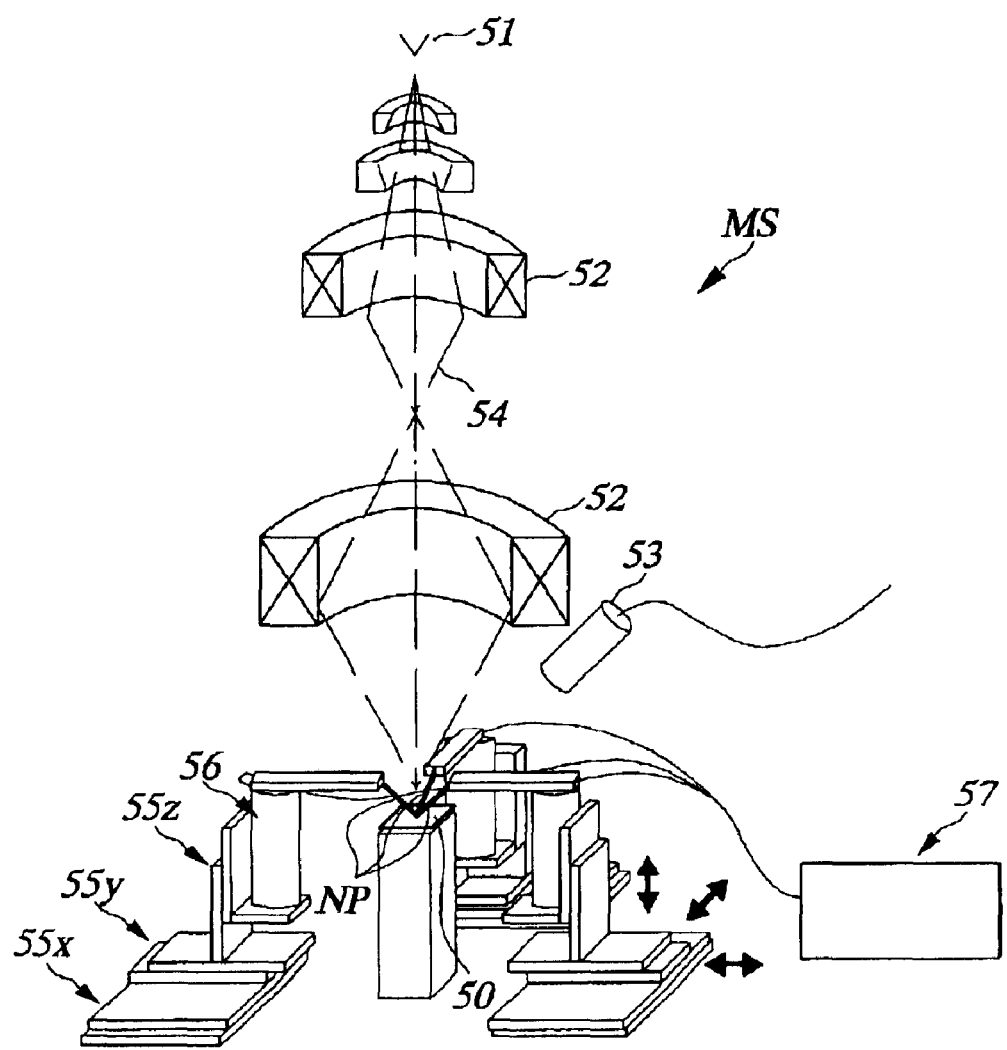
FIG. 17 is an enlarged cross-sectional view of the semiconductor substrate showing a state where a probe contacts the electrode pad provided in the TEG.
Figure 18:
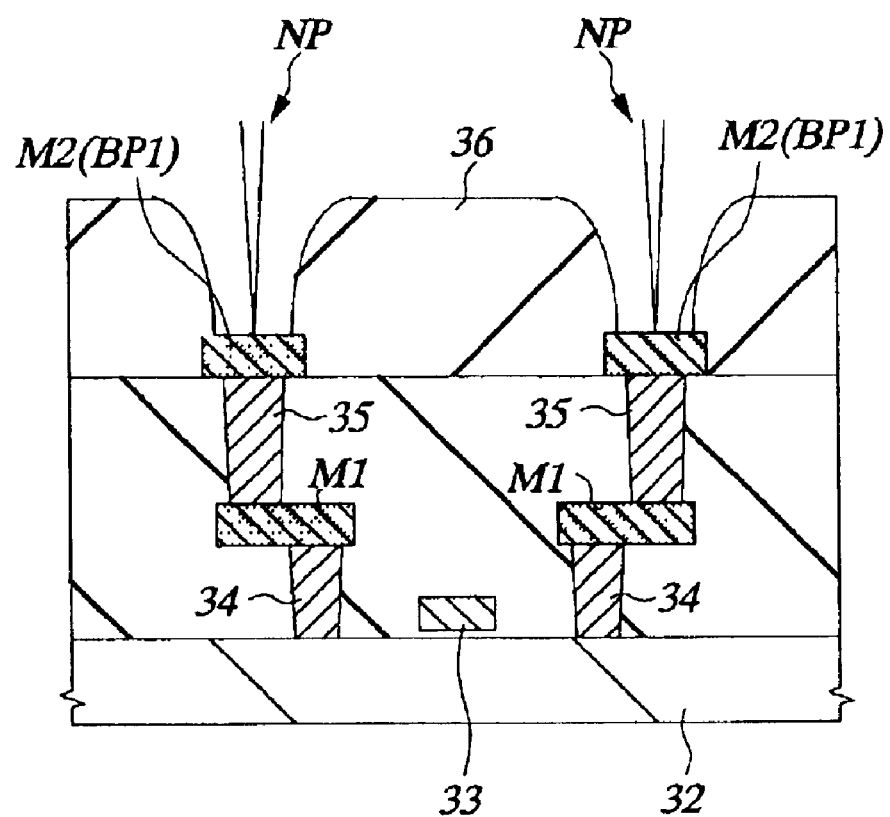
FIG. 18 is a schematic view of a measuring apparatus in which a plurality of nanoprobes are incorporated.

Next, a wafer is mounted on a sample stage 50 of the measuring apparatus MS (step 101 in FIG. 15) as shown in FIG. 17. Thereafter, as shown in FIG. 18, the tip portions of the plurality of the nanoprobes NP are contacted to the first electrode pad BP1 while observing them using, for example, a scanning electron microscope having a resolution in the order of nm (step 102 in FIG. 15).

The scanning electron microscope incorporated in the measuring apparatus MS is constituted of an electron source 51, deflection lenses 52, and a secondary electron detector 53. A primary electron beam 54 systematically scans the wafer, and the intensity of the secondary electron emitted from the wafer surface is recorded, thereby the pattern on the wafer is observed. The nanoprobes NP are moved to the position above the first electrode pad BP1 to be contacted to the nanoprobes NP. The movement of the nanoprobes is controlled using a probe movement mechanism constituted of coarse movement mechanisms 55x, 55y, and 55z for each of the nanoprobes, and a fine movement mechanism 56. Note that, though three nanoprobes NP are exemplified in FIG. 17, the number of nanoprobes is not limited to this.

Next, the contact between the nanoprobe and the electrode pad is accurately confirmed according to, for example, the saturation of the contact current (step 103 in FIG. 15). Thereafter, the current-voltage characteristic among the plurality of the nanoprobes NP is measured by the use of, for example, a general-purpose tester 57 (step 104 in FIG. 15), and thereby the electrical characteristic of the TEG can be obtained.

Note that, in the first embodiment, the scribe region SL is constituted of the first scribe region SL1, in which the TEG provided with the first electrode pad BP1 is arranged, and the second scribe region SL2, in which the TEG provided with the second electrode pad BP2 is arranged. However, it is also possible to arrange either of the TEG provided with first electrode pad BP1 or the TEG provide with the second electrode pad BP2 in the scribe region SL.

As described above, according to the first embodiment, a great number of TEGs can be arranged in the scribe region SL on a wafer, and it is possible to obtain a large amount of data by evaluating the characteristic of the TEG. Therefore, it becomes possible to maintain and improve the yield of a semiconductor product in the development and in the mass production thereof.

(Second Embodiment)

In the foregoing first embodiment, descriptions have been made for the TEG provided with the first electrode pad BP1 which is a rectangular electrode having a side length of 0.5 $\mu$m or shorter and the TEG provided with the second electrode pad BP2 which is a rectangular electrode having a side length of 20 $\mu$m or longer. In this second embodiment, however, descriptions will be made for a TEG provided with both of the first electrode pad BP1, which is a rectangular electrode having a side length of 0.5 $\mu$m or shorter, and the second electrode pad BP2, which is a rectangular electrode having a side length of 20 $\mu$m or longer.

Figure 19:
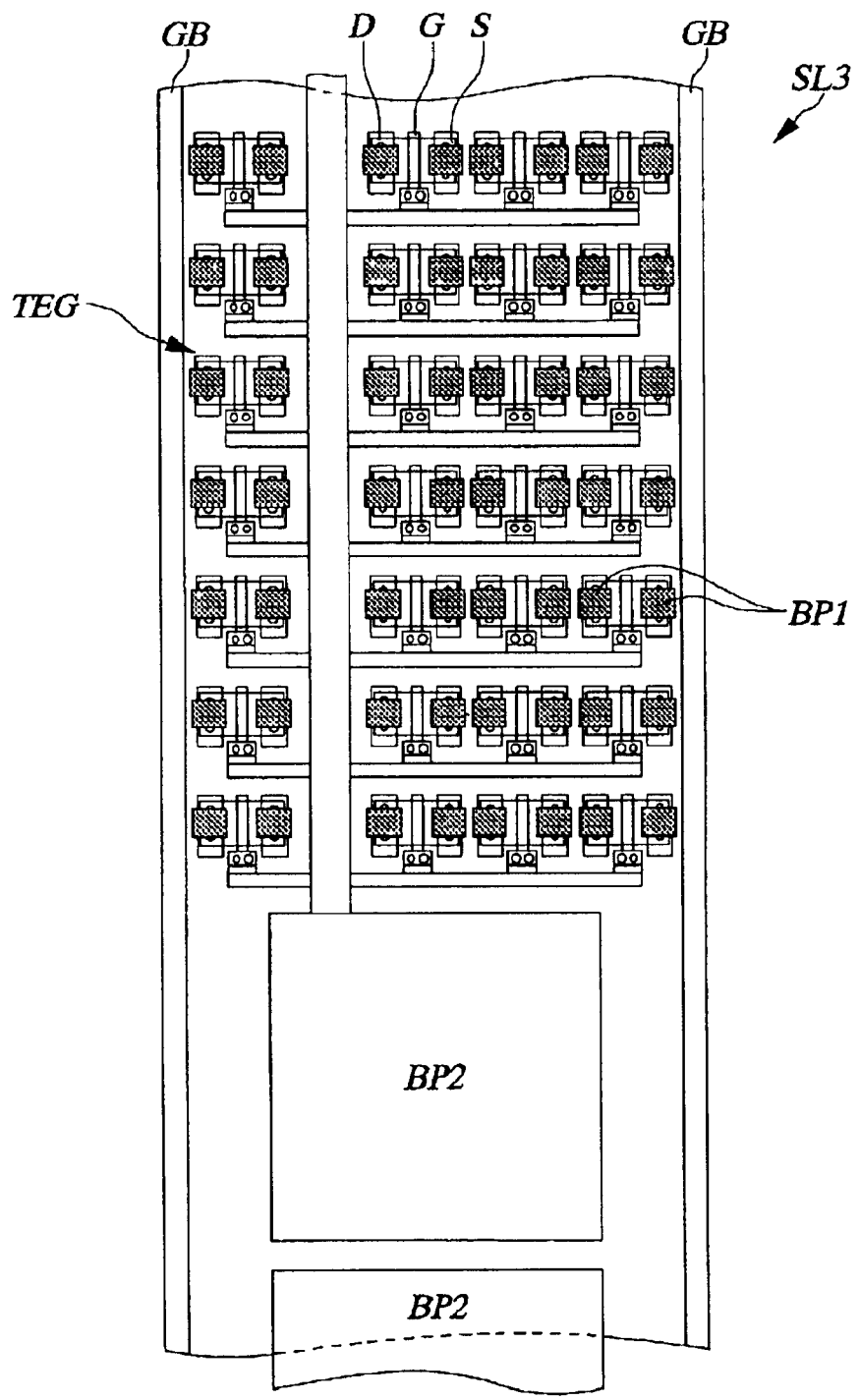
FIG. 19 is a plan view showing an example of the principal part of the plurality of TEGs and electrode pads arranged in a third scribe region.

FIG. 19 is a plan view showing an example of the principal part of a plurality of TEGs and electrode pads arranged in a third scribe region SL3.

The TEG constituted of the MISFET is shown in the third scribe region SL3 as an example. The first electrode pad BP1 (represented by a half-tone dot meshing in FIG. 19) is a minute rectangular electrode having a side length of 0.5 $\mu$m or so and each of the first electrode pads BP1 is an independent pattern having no wire-connection with other electrodes. The first electrode pad BP1 is connected to each of the source S and the drain D of the MISFET. On the other hand, the second electrode pad BP2, which is a rectangular electrode having a side length of about 80 $\mu$m, and one second electrode pad BP2 are connected to the gates G of the plurality of the MISFETs or, alternatively, to the wells (or semiconductor substrates) of the plurality of the MISFETs. Since the impedance is decreased by connecting the second electrode pad BP2 to the gate G and the well (or semiconductor substrate), it is possible to reduce the variance of a signal voltage when the signal voltage from outside is supplied to the MISFET.

Figure 20:
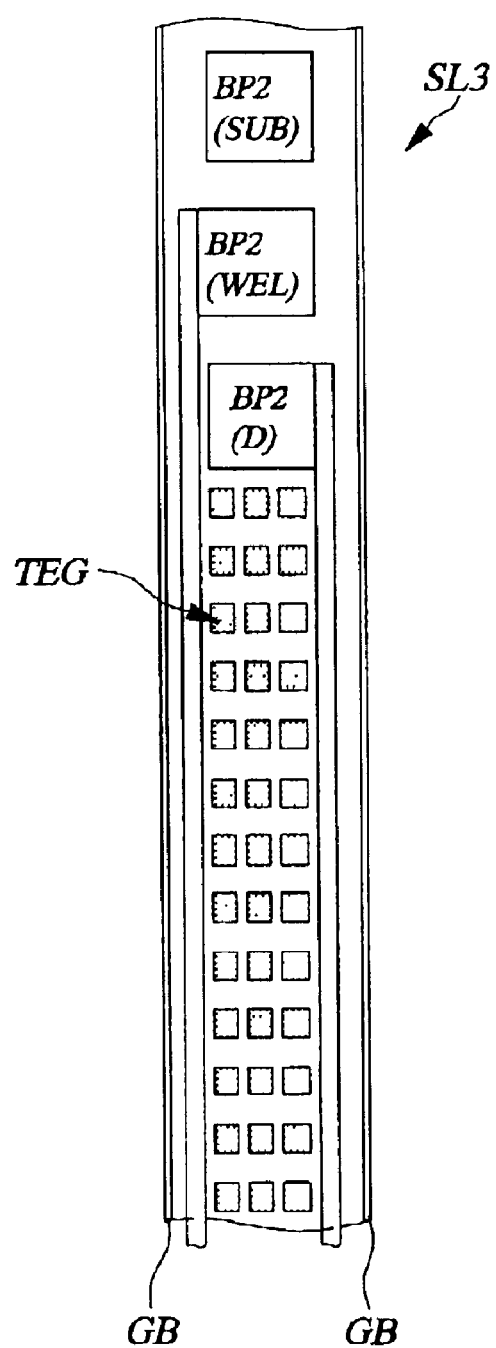
FIG. 20 is a schematic view showing an arrangement example of the plurality of TEGs and the electrode pads arranged in the third scribe region.

FIG. 20 is a schematic view showing an arrangement region (represented by a half-tone dot meshing in FIG. 20) of the TEG in the case where the plurality of TEGs arranged in the third scribe region SL3 are constituted of the MISFETs, and also showing an example of the arrangement of the second electrode pad BP2. The first electrode pad BP1 is disposed in the arrangement region of the TEG represented by a half-tone dot meshing in FIG. 20.

A substrate potential, a well potential, and a power supply voltage supplied to the drain are fed using each of the second electrode pads BP2 (SUB), BP2 (WEL), and BP2 (D), and one second electrode pad BP2 is connected commonly to the plurality of the MISFETs. Therefore, it is possible to provide a sufficient ground property to, for example, the substrate potential and the well potential. On the other hand, though not shown, a voltage supplied to the gate or a ground potential supplied to the source are fed using the first electrode pad BP1, and the nanoprobe NP is contacted to the first electrode pad BP1 at the time of the measurement.

Figure 21:
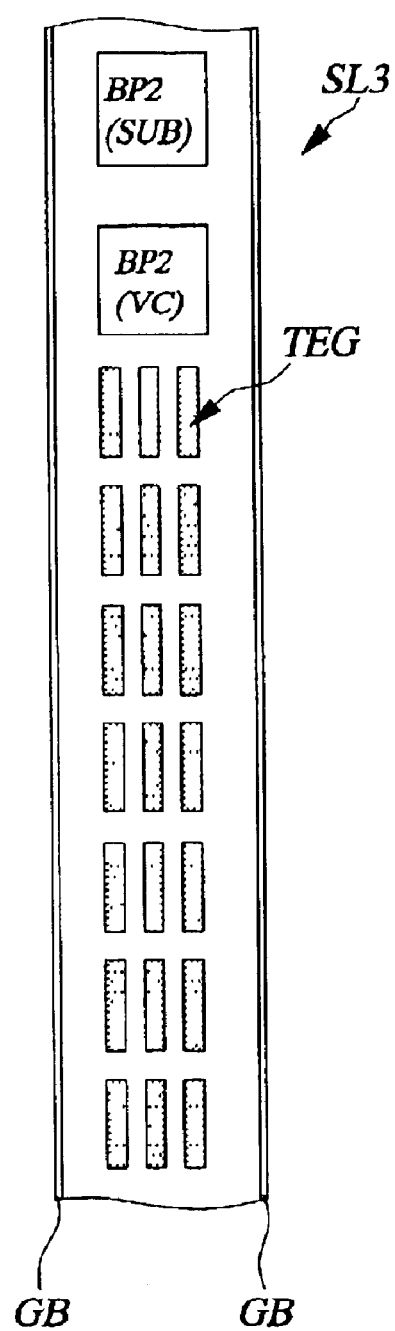
FIG. 21 is a schematic view showing another arrangement example of the plurality of TEGs and the electrode pads arranged in the third scribe region.

FIG. 21 is a schematic view showing an arrangement region (represented by a half-tone dot meshing in FIG. 21) of the TEG in the case where the plurality of TEGs are constituted of high-frequency circuits such as ring oscillators arranged in the third scribe region SL3, and also showing an example of the arrangement of the second electrode pad BP2. The first electrode pad BP1 is disposed in the arrangement region of the TEG represented by a half-tone dot meshing in FIG. 21.

A substrate potential and a power supply voltage are fed using each second electrode pad BP2 (SUB) and BP2 (VC), and one second electrode pad BP2 is connected commonly to the plurality of the high frequency circuits. Therefore, it is possible to provide a sufficient ground property to, for example, the substrate potential or the high-frequency power supply voltage. On the other hand, though not shown, an electric power is fed to an input terminal and an output terminal using the first electrode pad BP1, and the nanoprobe NP is contacted to the first electrode pad BP1 at the time of the measurement.

As described above, according to the second embodiment, when it is necessary that the substrate (or well) potential or the power supply voltage is stably supplied, both of the electrode pad BP1 and the second electrode pad BP2 provided in one TEG are used together with each other. The use of the first electrode pad BP1 makes it possible to achieve the high integration of the TEG. At the same time, the substrate (or well) potential or the power supply voltage is supplied from the second electrode pad BP2 shared by the plurality of the TEGs, which makes it possible to supply the favorable ground property to the TEG from outside.

(Third Embodiment)

Figure 22A:
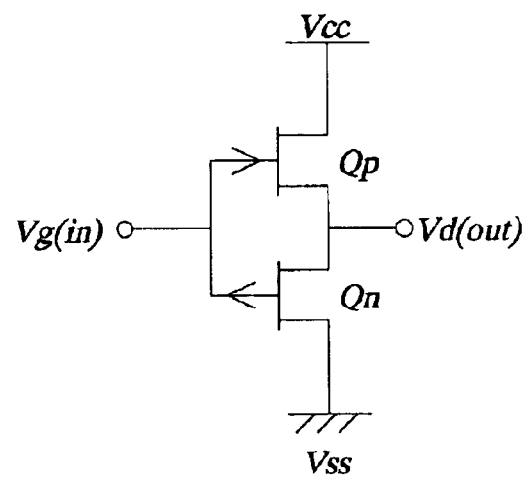
FIG. 22A is a circuit diagram of a CMOS inverter circuit.
Figure 22B:
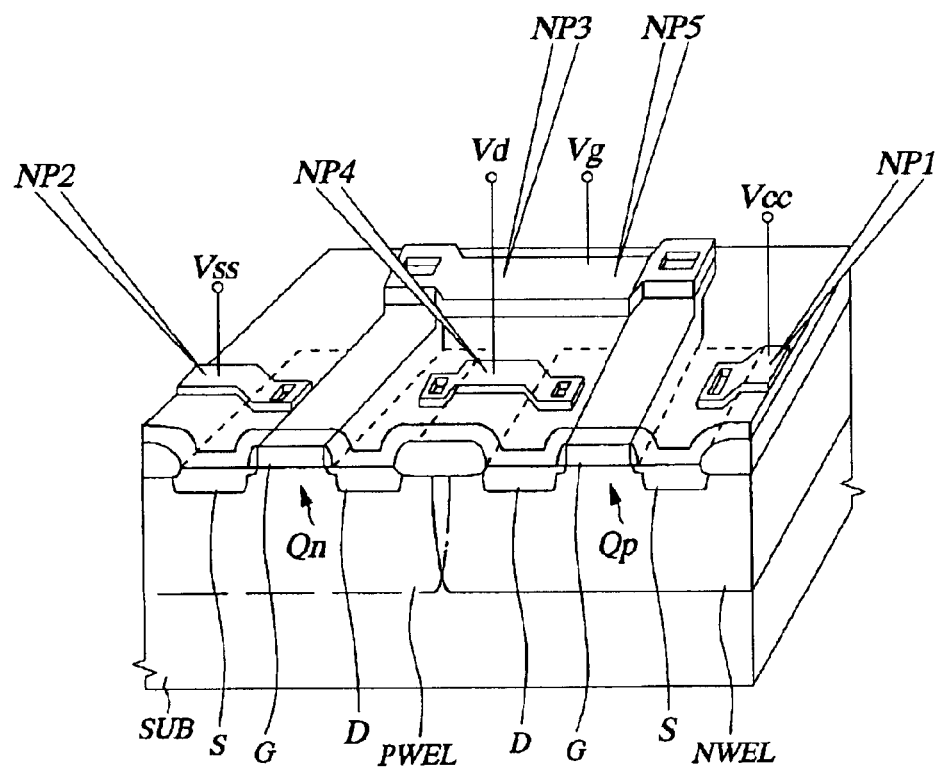
FIG. 22B is a perspective view showing the principal part of a semiconductor substrate illustrating the CMOS inverter circuit.

Descriptions will be made for the characteristic evaluation or the failure analysis of an actual device of a semiconductor product using a nanoprobe according to the third embodiment. A CMOS inverter circuit that is one of the basic logic circuits shown in FIG. 22 is exemplified as the actual device, and the measuring method of a logic value thereof will be described. FIG. 22A is a circuit diagram of a CMOS inverter circuit, and FIG. 22B is a perspective view showing the principal part of a semiconductor substrate illustrating an n channel MISFET Qn and a p channel MISFET Qp constituting the CMOS inverter circuit. In FIG. 22B, an example where a nanoprobe is contacted to an extraction electrode constituted of a first wiring layer is shown. In the case of a multi-layered wiring, however, the nanoprobe can be contacted to an extraction electrode constituted of the uppermost layer wiring of the two or more wiring layer. In FIG. 22B, the reference symbol SUB denotes a semiconductor substrate, PWEL denotes a p well, and NWEL denotes an n well.

In the logic circuit constituted of n inputs and m outputs, the measurement is performed using (n+m+3) nanoprobes. The details of the +3 are a nanoprobe for the substrate potential, a nanoprobe for the power supply potential, and a nanoprobe for contact confirmation. In the case of determining the failure portion in the multi-input/multi-output logic circuit, the nanoprobe for contact confirmation can function to record a voltage of an arbitrary node on the multi-input/multi-output logic circuit. In this embodiment, 5 nanoprobes NP1 to NP5 are used.

First, after forming an opening hole on a surface of a passivation film on an extraction electrode used in the measurement, each of the nanoprobes NP1 to NP5 is contacted to each extraction electrode. The nanoprobe NP1 can be contacted to the source S of the p channel MISFET Qp, the nanoprobe NP2 can be contacted to the source S of the n channel MISFET Qn, the nanoprobe NP3 can be contacted to the commonly connected gates G of the n channel MISFET Qn and the p channel MISFET Qp, and the nanoprobe NP4 can be contacted to the commonly connected drains D of the n channel MISFET Qn and the p channel MISFET Qp. The nanoprobe NP5 is a probe for contact confirmation used to confirm an ohmic contact.

Next, the electrical resistance is measured between the nanoprobe NP3 and the nanoprobe NP5. Both of the nanoprobes NP3 and NP5 are dropped on the extraction electrode until the measured electrical resistance becomes equal to the inherent resistance expected based on the contacted materials.

Next, a power supply voltage (Vcc) is applied to the nanoprobe NP1, and a ground potential (Vss) is applied to the nanoprobe NP2. When a high potential of, for example, 5V is applied to the nanoprobe NP3 on an input terminal (in), a low potential (Vd) of, for example, 0V is observed in the nanoprobe NP4 on an output terminal (out). Also, when a low potential (Vg) of, for example, 0V is applied to the nanoprobe NP3 on the input terminal (in), a high potential (Vd) of, for example, 5V is observed in the nanoprobe NP4 on the output terminal (out). As described above, it is possible to confirm the normal logic operation of the CMOS inverter circuit.

When the CMOS inverter circuit does not operate in line with the truth table, it is conceived that there exist some failures in one or some of the MISFETs, the wiring, or the connection portion. For example, in such a case where the low potential (Vd) is not observed in the output terminal (out) and the potential proportional to the resistance of the p channel MISFET Qp and the n channel MISFET Qn is outputted, though the high potential (Vg) is applied to the input terminal (in), there is a high possibility of the short-circuit of the p channel MISFET Qp. Also, in such a case where the high potential (Vd) of the output terminal (out) is not observed and the potential proportional to the resistance of the p channel MISFET Qp and the n channel MISFET Qn is outputted, though the low potential (Vg) is applied to the input terminal (in), there is high possibility of the short-circuit of the n channel MISFET Qn.

The logic circuit is basically constituted of circuits having a logic function such as an inverter circuit, a NAND circuit and NOR circuit. Therefore, even in a large-scale logic circuit, if the logic circuit is separated into the basic logic circuits and measured, it is possible to identify which basic logic circuit has a failure. Further, it is also possible to detect the failure in an element in the basic logic circuit.

According to the third embodiment described above, the characteristic evaluation or the failure analysis of an actual device can be performed by contacting a nanoprobe NP to an arbitrary extraction electrode of a semiconductor product. Therefore, it becomes possible to identify the various characteristics and the failure portion in each basic circuit unit. In addition, it is possible to narrow down the failure portion and the failure circuit in the semiconductor product in a short time. Thus, the improvement of the yield of the semiconductor product can be achieved.

In the foregoing, the invention made by the inventors thereof has been concretely described based on the embodiments. However, it goes without saying that the present invention is not limited to the foregoing embodiments and the various changes and modifications can be made within the scope of the present invention.

For example, though the TEG used to evaluate a semiconductor product is arranged in a scribe region in the foregoing embodiments, the TEG can be arranged in the semiconductor circuit region. By doing so, it becomes possible to perform the characteristic evaluation or the failure analysis even in a chip-shaped semiconductor product. Therefore, the data required to perform the failure analysis can be obtained also from the chip-shaped semiconductor product, and thus the improvement of the yield of the semiconductor product can be achieved.

The advantages achieved by the typical ones of the inventions disclosed in this application will be briefly described as follows.

The measurement of a plurality of TEGs arranged in a scribe region makes it possible to improve the yield of a semiconductor device.

The characteristic evaluation or the failure analysis of an actual device in a semiconductor product is performed, which makes it possible to improve the yield of a semiconductor device.

The characteristic evaluation or the failure analysis of TEGs arranged in a semiconductor circuit region is performed, which makes it possible to improve the yield of a semiconductor device.

What is claimed is:

1. A method of manufacturing a semiconductor device, comprising the steps of:

(a) forming a bonding pad and an extraction electrode each comprised of an uppermost layer wiring in a product circuit region;

(b) forming a protection film on an upper layer of said uppermost layer wiring; and (c) partially exposing a surface of said bonding pad by removing a predetermined part of said protection film, wherein said uppermost layer wiring is formed by depositing a conductive body and then patterning by a lithography method, a plurality of logic circuits provided with said extraction electrode are formed in said product circuit region, and after partially exposing the surface of said extraction electrode by removing said protection film on said extraction electrode, a probe having a tip radius of curvature of about 0.05 $\mu$m to 0.8 $\mu$m is contacted to said extraction electrode, and then logic values of said logic circuits are evaluated.

2. The method of manufacturing a semiconductor device according to claim 1;

wherein said protection film on said extraction electrode is removed by a focused ion beam method or a selective etching method.

3. The method of manufacturing a semiconductor device according to claim 1;

wherein said logic circuit comprises n input terminals and m output terminals, and n+m+3 probes are contacted to said extraction electrodes to evaluate a logic value of said logic circuit.

4. The method of manufacturing a semiconductor device according to claim 3, wherein one of said probes is a probe for contact confirmation.

5. The method of manufacturing a semiconductor device according to claim 1, wherein said probe contains tungsten as a main component.

6. The method of manufacturing a semiconductor device according to claim 1, wherein said logic circuits are TEG elements.

* * * * *